(12) United States Patent
Rao et al.

(10) Patent No.: US 12,031,228 B2
(45) Date of Patent: *Jul. 9, 2024

(54) ORGANIC SOLID CRYSTAL—METHOD AND STRUCTURE

(71) Applicant: META PLATFORMS TECHNOLOGIES, LLC, Menlo Park, CA (US)

(72) Inventors: Tingling Rao, Bellevue, WA (US); Kimberly Kay Childress, Duvall, WA (US); Arman Boromand, Issaquah, WA (US); Tanya Malhotra, Robbinsdale, MN (US); Lafe Joseph Purvis, II, Redmond, WA (US); Taha Masood, Sammamish, WA (US); Poer Sung, Woodinville, WA (US); Andrew John Ouderkirk, Kirkland, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 147 days.

This patent is subject to a terminal disclaimer.

(21) Appl. No.: 17/702,219

(22) Filed: Mar. 23, 2022

(65) Prior Publication Data

US 2023/0034754 A1 Feb. 2, 2023

Related U.S. Application Data

(60) Provisional application No. 63/224,303, filed on Jul. 21, 2021.

(51) Int. Cl.
 *C30B 29/54* (2006.01)
 *C30B 13/06* (2006.01)
 *G02B 1/08* (2006.01)

(52) U.S. Cl.
 CPC .............. *C30B 13/06* (2013.01); *C30B 29/54* (2013.01); *G02B 1/08* (2013.01)

(58) Field of Classification Search
 CPC ....... C30B 29/54; C30B 29/64; C30B 19/106; C30B 35/002; B29C 33/58; B29C 33/60; B29C 33/62
 See application file for complete search history.

(56) References Cited

U.S. PATENT DOCUMENTS 5,385,116 A * 1/1995 Hattori .................... C30B 29/58
117/5
5,746,823 A 5/1998 Leyderman
(Continued)

FOREIGN PATENT DOCUMENTS

EP 0352931 A1 1/1990
JP 2008-302615 * 12/2006
(Continued)

OTHER PUBLICATIONS

Zhang et al. "measuring anisotropic refractive indicies and film thicknesses of thin organic crystals using the prism coupling method" Applied Optices vol. 27, No. 7 Apr. 1988 pp. 1358-1362.*
(Continued)

*Primary Examiner* — Robert M Kunemund
(74) *Attorney, Agent, or Firm* — Greenberg Traurig, LLP

(57) ABSTRACT

A method of forming an organic solid crystal (OSC) thin film includes forming a layer of a non-volatile medium material over a surface of a mold, forming a layer of a molecular feedstock over a surface of the non-volatile medium material, the molecular feedstock including an organic solid crystal precursor, forming crystal nuclei from the organic solid crystal precursor, and growing the crystal nuclei to form the organic solid crystal thin film. An organic solid crystal (OSC) thin film may include a biaxially- (Continued)

oriented organic solid crystal layer having mutually orthogonal refractive indices, $n_1 \neq n_2 \neq n_3$.

19 Claims, 20 Drawing Sheets

(56) References Cited

U.S. PATENT DOCUMENTS

| | | | |
|---|---|---|---|
| 5,832,480 A | 11/1998 | Byrd, Jr. et al. | |
| 5,918,014 A | 6/1999 | Robinson | |
| 6,539,232 B2 | 3/2003 | Hendrey et al. | |
| 6,957,184 B2 | 10/2005 | Schmid et al. | |
| 7,069,308 B2 | 6/2006 | Abrams | |
| 7,379,811 B2 | 5/2008 | Rasmussen et al. | |
| 7,539,697 B1 | 5/2009 | Akella et al. | |
| 7,565,157 B1 | 7/2009 | Ortega et al. | |
| 7,752,326 B2 | 7/2010 | Smit | |
| 7,783,630 B1 | 8/2010 | Chevalier et al. | |
| 7,836,044 B2 | 11/2010 | Kamvar et al. | |
| 8,027,990 B1 | 9/2011 | Mysen et al. | |
| 8,055,673 B2 | 11/2011 | Churchill et al. | |
| 8,060,639 B2 | 11/2011 | Smit et al. | |
| 8,082,278 B2 | 12/2011 | Agrawal et al. | |
| 8,112,529 B2 | 2/2012 | Van Den Oord et al. | |
| 8,135,721 B2 | 3/2012 | Joshi et al. | |
| 8,145,636 B1 | 3/2012 | Jeh et al. | |
| 8,180,804 B1 | 5/2012 | Narayanan et al. | |
| 8,185,558 B1 | 5/2012 | Narayanan et al. | |
| 8,239,364 B2 | 8/2012 | Wable et al. | |
| 8,244,848 B1 | 8/2012 | Narayanan et al. | |
| 8,271,471 B1 | 9/2012 | Kamvar et al. | |
| 8,271,546 B2 | 9/2012 | Gibbs | |
| 8,301,639 B1 | 10/2012 | Myllymaki et al. | |
| 8,306,922 B1 | 11/2012 | Kunal et al. | |
| 8,312,056 B1 | 11/2012 | Peng et al. | |
| 8,321,364 B1 | 11/2012 | Gharpure et al. | |
| 8,364,709 B1 | 1/2013 | Das et al. | |
| 8,386,465 B2 | 2/2013 | Ansari et al. | |
| 8,407,200 B2 | 3/2013 | Wable et al. | |
| 8,412,749 B2 | 4/2013 | Fortuna et al. | |
| 8,463,295 B1 | 6/2013 | Caralis et al. | |
| 8,538,960 B2 | 9/2013 | Wong et al. | |
| 8,572,129 B1 | 10/2013 | Lee et al. | |
| 8,578,274 B2 | 11/2013 | Druzgalski et al. | |
| 8,583,659 B1 | 11/2013 | Alexandrescu et al. | |
| 8,595,297 B2 | 11/2013 | Marcucci et al. | |
| 8,601,027 B1 | 12/2013 | Behforooz et al. | |
| 8,606,721 B1 | 12/2013 | Dicker | |
| 8,639,725 B1 | 1/2014 | Udeshi et al. | |
| 8,732,208 B2 | 5/2014 | Lee et al. | |
| 8,751,521 B2 | 6/2014 | Lee et al. | |
| 8,775,324 B2 | 7/2014 | Zhu et al. | |
| 8,775,409 B1 | 7/2014 | Mehta et al. | |
| 8,782,080 B2 | 7/2014 | Lee et al. | |
| 8,782,753 B2 | 7/2014 | Lunt | |
| 8,832,111 B2 | 9/2014 | Venkataramani et al. | |
| 8,868,590 B1 | 10/2014 | Donneau-Golencer | |
| 8,868,603 B2 | 10/2014 | Lee et al. | |
| 8,898,226 B2 | 11/2014 | Tiu, Jr. et al. | |
| 8,909,637 B2 | 12/2014 | Patterson et al. | |
| 8,914,392 B2 | 12/2014 | Lunt et al. | |
| 8,918,418 B2 | 12/2014 | Lee et al. | |
| 8,924,406 B2 | 12/2014 | Lunt et al. | |
| 8,935,255 B2 | 1/2015 | Sankar et al. | |
| 8,935,261 B1 | 1/2015 | Piepgrass et al. | |
| 8,935,271 B2 | 1/2015 | Lassen et al. | |
| 8,949,232 B2 | 2/2015 | Harrington et al. | |
| 8,949,250 B1 | 2/2015 | Garg et al. | |
| 8,949,261 B2 | 2/2015 | Lunt et al. | |
| 8,954,675 B2 | 2/2015 | Venkataramani et al. | |
| 8,983,956 B1 | 3/2015 | Murphy et al. | |
| 8,983,991 B2 | 3/2015 | Sankar et al. | |
| 9,323,792 B2 | 4/2016 | Zhao et al. | |
| 9,602,965 B1 | 3/2017 | Kalis et al. | |
| 10,019,466 B2 | 7/2018 | Huang et al. | |
| 10,271,173 B1 | 4/2019 | Kalis et al. | |
| 10,282,434 B2 | 5/2019 | Ott et al. | |
| 2002/0059199 A1 | 5/2002 | Harvey | |
| 2002/0086676 A1 | 7/2002 | Hendrey et al. | |
| 2002/0196273 A1 | 12/2002 | Krause | |
| 2003/0154194 A1 | 8/2003 | Jonas | |
| 2003/0172867 A1 | 9/2003 | Shinnar et al. | |
| 2003/0208474 A1 | 11/2003 | Soulanille et al. | |
| 2004/0088325 A1 | 5/2004 | Elder et al. | |
| 2004/0172237 A1 | 9/2004 | Saldanha et al. | |
| 2004/0215793 A1 | 10/2004 | Ryan et al. | |
| 2004/0243568 A1 | 12/2004 | Wang et al. | |
| 2004/0255237 A1 | 12/2004 | Tong | |
| 2005/0091202 A1 | 4/2005 | Thomas | |
| 2005/0103258 A1 | 5/2005 | Lazarev | |
| 2005/0125408 A1 | 6/2005 | Somaroo et al. | |
| 2005/0131872 A1 | 6/2005 | Calbucci et al. | |
| 2005/0171955 A1 | 8/2005 | Hull et al. | |
| 2005/0256756 A1 | 11/2005 | Lam et al. | |
| 2006/0041597 A1 | 2/2006 | Conrad et al. | |
| 2006/0086312 A1 | 4/2006 | Bhowmik et al. | |
| 2006/0117378 A1 | 6/2006 | Tam et al. | |
| 2006/0136419 A1 | 6/2006 | Brydon et al. | |
| 2006/0190436 A1 | 8/2006 | Richardson et al. | |
| 2007/0174304 A1 | 7/2007 | Shrufi et al. | |
| 2007/0226187 A1 | 9/2007 | Beatty et al. | |
| 2007/0237918 A1* | 10/2007 | Jonza | B32B 27/08 428/43 |
| 2007/0277100 A1 | 11/2007 | Sheha et al. | |
| 2008/0005064 A1 | 1/2008 | Sarukkai | |
| 2008/0033926 A1 | 2/2008 | Matthews et al. | |
| 2008/0065623 A1 | 3/2008 | Zeng et al. | |
| 2008/0072180 A1 | 3/2008 | Chevalier et al. | |
| 2008/0102856 A1 | 5/2008 | Fortescue et al. | |
| 2008/0114730 A1 | 5/2008 | Larimore et al. | |
| 2008/0133124 A1 | 6/2008 | Sarkeshik | |
| 2008/0183694 A1 | 7/2008 | Cane et al. | |
| 2008/0183695 A1 | 7/2008 | Jadhav | |
| 2008/0270615 A1 | 10/2008 | Centola et al. | |
| 2009/0006077 A1 | 1/2009 | Keaveney | |
| 2009/0006543 A1 | 1/2009 | Smit | |
| 2009/0054043 A1 | 2/2009 | Hamilton et al. | |
| 2009/0094200 A1 | 4/2009 | Baeza-Yates et al. | |
| 2009/0100342 A1 | 4/2009 | Jakobson | |
| 2009/0164408 A1 | 6/2009 | Grigorik et al. | |
| 2009/0164431 A1 | 6/2009 | Zivkovic et al. | |
| 2009/0164929 A1 | 6/2009 | Chen et al. | |
| 2009/0197681 A1 | 8/2009 | Krishnamoorthy et al. | |
| 2009/0228296 A1 | 9/2009 | Ismalon | |
| 2009/0259624 A1 | 10/2009 | DeMaris et al. | |
| 2009/0259646 A1 | 10/2009 | Fujita et al. | |
| 2009/0265326 A1 | 10/2009 | Lehrman et al. | |
| 2009/0271370 A1 | 10/2009 | Jagadish et al. | |
| 2009/0276414 A1 | 11/2009 | Gao et al. | |
| 2009/0281988 A1 | 11/2009 | Yoo | |
| 2009/0299963 A1 | 12/2009 | Pippuri | |
| 2010/0049802 A1 | 2/2010 | Raman | |
| 2010/0057723 A1 | 3/2010 | Rajaram | |
| 2010/0082695 A1 | 4/2010 | Hardt | |
| 2010/0125562 A1 | 5/2010 | Nair et al. | |
| 2010/0145771 A1 | 6/2010 | Fligler et al. | |
| 2010/0161215 A1 | 6/2010 | Karani | |
| 2010/0179929 A1 | 7/2010 | Yin et al. | |
| 2010/0197318 A1 | 8/2010 | Petersen et al. | |
| 2010/0228744 A1 | 9/2010 | Craswell et al. | |
| 2010/0235354 A1 | 9/2010 | Gargaro et al. | |
| 2010/0279708 A1 | 11/2010 | Lidsröm et al. | |
| 2010/0321399 A1 | 12/2010 | Ellren et al. | |
| 2011/0022602 A1 | 1/2011 | Luo et al. | |
| 2011/0072034 A1 | 3/2011 | Sly et al. | |
| 2011/0078166 A1 | 3/2011 | Oliver et al. | |
| 2011/0087534 A1 | 4/2011 | Strebinger et al. | |
| 2011/0106807 A1 | 5/2011 | Srihari et al. | |
| 2011/0137902 A1 | 6/2011 | Wable et al. | |
| 2011/0184945 A1 | 7/2011 | Das et al. | |
| 2011/0184981 A1 | 7/2011 | Lu et al. | |
| 2011/0191371 A1 | 8/2011 | Elliott | |
| 2011/0196855 A1 | 8/2011 | Wable et al. | |
| 2011/0231296 A1 | 9/2011 | Gross et al. | |

(56) References Cited

U.S. PATENT DOCUMENTS

| | | |
|---|---|---|
| 2011/0238591 A1 | 9/2011 | Kerr et al. |
| 2011/0264664 A1 | 10/2011 | Xiao et al. |
| 2011/0276396 A1 | 11/2011 | Rathod |
| 2011/0313992 A1 | 12/2011 | Groeneveld et al. |
| 2011/0320470 A1 | 12/2011 | Williams et al. |
| 2012/0047147 A1 | 2/2012 | Redstone et al. |
| 2012/0059708 A1 | 3/2012 | Galas et al. |
| 2012/0136852 A1 | 5/2012 | Geller |
| 2012/0166432 A1 | 6/2012 | Tseng |
| 2012/0166433 A1 | 6/2012 | Tseng |
| 2012/0179637 A1 | 7/2012 | Juan et al. |
| 2012/0185472 A1 | 7/2012 | Ahmed et al. |
| 2012/0185486 A1 | 7/2012 | Voigt et al. |
| 2012/0209832 A1 | 8/2012 | Neystadt et al. |
| 2012/0221581 A1 | 8/2012 | Narayanan et al. |
| 2012/0271831 A1 | 10/2012 | Narayanan et al. |
| 2012/0278127 A1 | 11/2012 | Kirakosyan et al. |
| 2012/0284329 A1 | 11/2012 | Van Den Oord et al. |
| 2012/0290950 A1 | 11/2012 | Rapaport et al. |
| 2012/0310922 A1 | 12/2012 | Johnson et al. |
| 2012/0311034 A1 | 12/2012 | Goldband et al. |
| 2012/0317088 A1 | 12/2012 | Pantel et al. |
| 2012/0331063 A1 | 12/2012 | Rajaram |
| 2013/0031106 A1 | 1/2013 | Schechter et al. |
| 2013/0031113 A1 | 1/2013 | Feng et al. |
| 2013/0041876 A1 | 2/2013 | Dow et al. |
| 2013/0066876 A1 | 3/2013 | Raskino et al. |
| 2013/0073400 A1 | 3/2013 | Heath |
| 2013/0080881 A1 | 3/2013 | Goodspeed et al. |
| 2013/0085970 A1 | 4/2013 | Karnik et al. |
| 2013/0086024 A1 | 4/2013 | Liu et al. |
| 2013/0086057 A1 | 4/2013 | Harrington et al. |
| 2013/0097140 A1 | 4/2013 | Scheel et al. |
| 2013/0103697 A1 | 4/2013 | Hill et al. |
| 2013/0124538 A1 | 5/2013 | Lee et al. |
| 2013/0124542 A1 | 5/2013 | Lee et al. |
| 2013/0144899 A1 | 6/2013 | Lee et al. |
| 2013/0166526 A1 | 6/2013 | Moxley et al. |
| 2013/0173633 A1 | 7/2013 | Piepgrass et al. |
| 2013/0191372 A1 | 7/2013 | Lee et al. |
| 2013/0191416 A1 | 7/2013 | Lee et al. |
| 2013/0198219 A1 | 8/2013 | Cohen et al. |
| 2013/0204737 A1 | 8/2013 | Agarwal et al. |
| 2013/0226918 A1 | 8/2013 | Berkhim et al. |
| 2013/0227011 A1 | 8/2013 | Sharma et al. |
| 2013/0246404 A1 | 9/2013 | Annau et al. |
| 2013/0254305 A1 | 9/2013 | Cheng et al. |
| 2013/0346421 A1 | 12/2013 | Wang et al. |
| 2014/0006416 A1 | 1/2014 | Leslie et al. |
| 2014/0067535 A1 | 3/2014 | Rezaei et al. |
| 2014/0122465 A1 | 5/2014 | Bilinski et al. |
| 2014/0164511 A1 | 6/2014 | Williams et al. |
| 2014/0244619 A1 | 8/2014 | Doroshenko |
| 2014/0274358 A1 | 9/2014 | Hoskins et al. |
| 2014/0274404 A1 | 9/2014 | Hoskins et al. |
| 2014/0279722 A1 | 9/2014 | Singh et al. |
| 2014/0279739 A1 | 9/2014 | Elkington et al. |
| 2014/0358836 A1 | 12/2014 | Moore et al. |
| 2015/0032747 A1 | 1/2015 | Giverts et al. |
| 2015/0142822 A1 | 5/2015 | Xue et al. |
| 2015/0269139 A1 | 9/2015 | McAteer et al. |
| 2015/0308850 A1 | 10/2015 | Krugman et al. |
| 2016/0321345 A1 | 11/2016 | Todic et al. |
| 2017/0052958 A1 | 2/2017 | Manning et al. |
| 2017/0132226 A1 | 5/2017 | Kalis et al. |
| 2017/0134508 A1 | 5/2017 | Kalis et al. |
| 2017/0199927 A1 | 7/2017 | Moore et al. |
| 2017/0201851 A1 | 7/2017 | Huang et al. |

FOREIGN PATENT DOCUMENTS

| | | |
|---|---|---|
| JP | 2013045435 A | 3/2013 |
| JP | 2016525762 A | 8/2016 |

OTHER PUBLICATIONS

International Search report and Written Opinion for International Application No. PCT/US2022/037637, dated Jan. 4, 2023, 17 pages.

Ching A., "Giraph: Production-grade Graph Processing Infrastructure for Trillion Edge Graphs," Jun. 22, 2014, 43 pages.

International Preliminary Report on Patentability for International Application No. PCT/US2022/037637, mailed Feb. 1, 2024, 13 pages.

Invitation to Pay Additional Fees for International Application No. PCT/US2022/037637, mailed Oct. 31, 2022, 12 pages.

Kabiljo M., et al., "Recommending Items to More than a Billion People," Engineering Blog, Facebook Code [online], Jun. 2, 2015 [Retrieved on Jan. 21, 2016], 14 pages, Retrieved from the Internet: URL: https://code.facebook.com/posts/861999383875667/recommending-items-to-more-than-a-billion-people/.

Zhu X., et al., "Learning from Labeled and Unlabeled Data with Label Propagation," Sep. 16, 2002, 8 Pages.

* cited by examiner

A

B

*A*

*B*

A

B

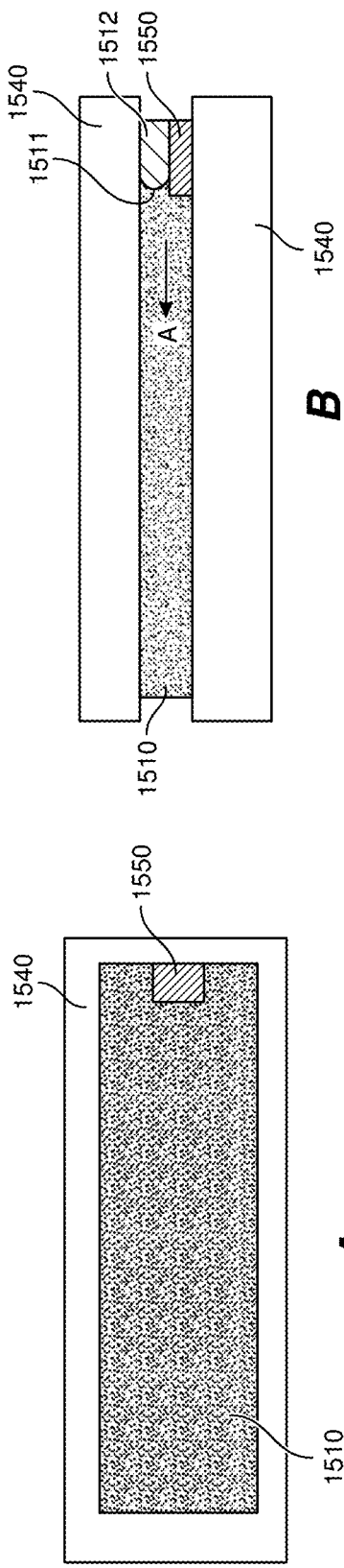
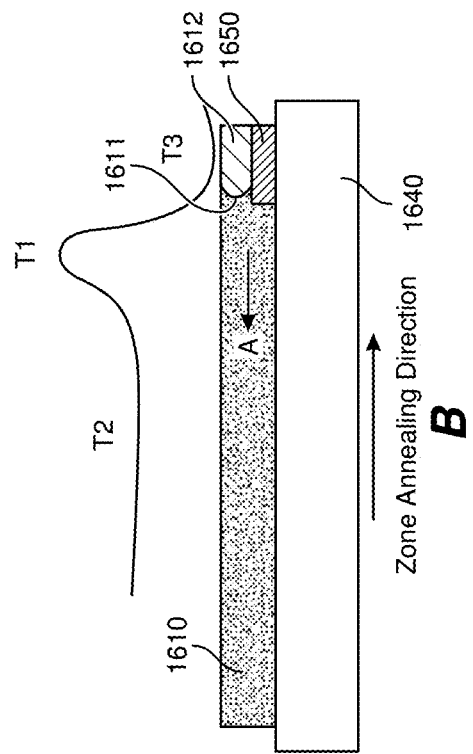
FIG. 15
FIG. 16

1-Flouro-4-Phenylethynyl-Benzene

1-Flouro-4-Phenylethynyl-Benzene

4-Flouro-4'-(Phenylethynyl)Benzophenone

4-[(4-Flourophenyl)Ethynyl]phenol

1-Flouro-4-(Phenylethynyl)-Benzene 4-(2-Phenylethynyl)phenol

1-Methoxy-4-[(4-Methoxyohenyl)Ethynyl]benzene

ORGANIC SOLID CRYSTAL—METHOD AND STRUCTURE

CROSS-REFERENCE TO RELATED APPLICATION

This application claims the benefit of priority under 35 U.S.C. § 119(e) of U.S. Provisional Application No. 63/224,303, filed Jul. 21, 2021, the contents of which are incorporated herein by reference in their entirety.

BRIEF DESCRIPTION OF THE DRAWINGS

The accompanying drawings illustrate a number of exemplary embodiments and are a part of the specification. Together with the following description, these drawings demonstrate and explain various principles of the present disclosure.

FIG. 15 is an illustration showing (A) a top down view and (B) a side view of an example crystal growth configuration having a single nucleation site for manufacturing an organic solid crystal (OSC) thin film according to some embodiments.

FIG. 16 is an illustration showing (A) a top down view and (B) a side view of an example crystal growth configuration having plural nucleation sites for manufacturing an organic solid crystal (OSC) thin film according to some embodiments.

Figure 1:
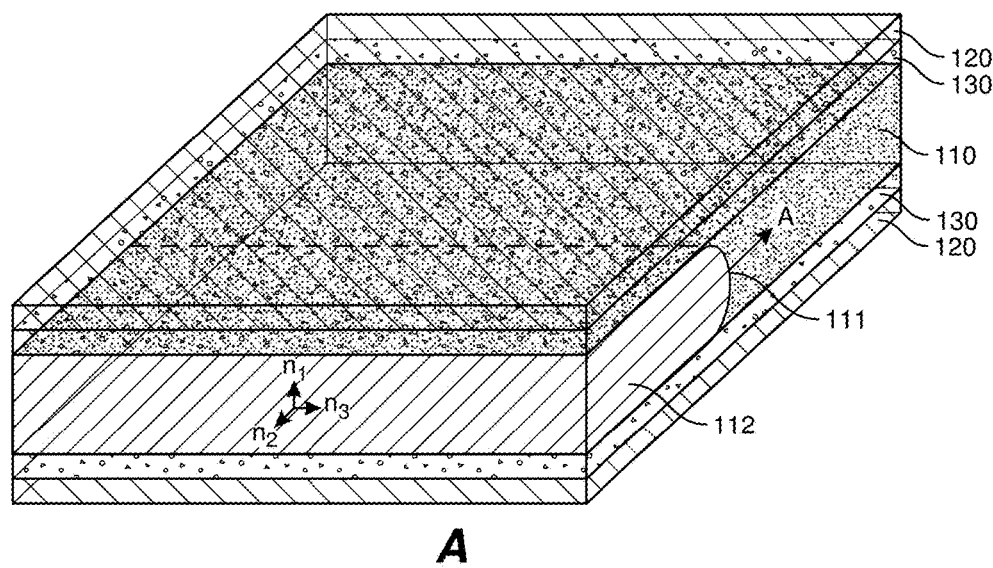
FIG. 1 illustrates example methods for manufacturing (A) a free-standing organic solid crystal material and (B) a supported organic solid crystal material according to various embodiments.
Figure 1:
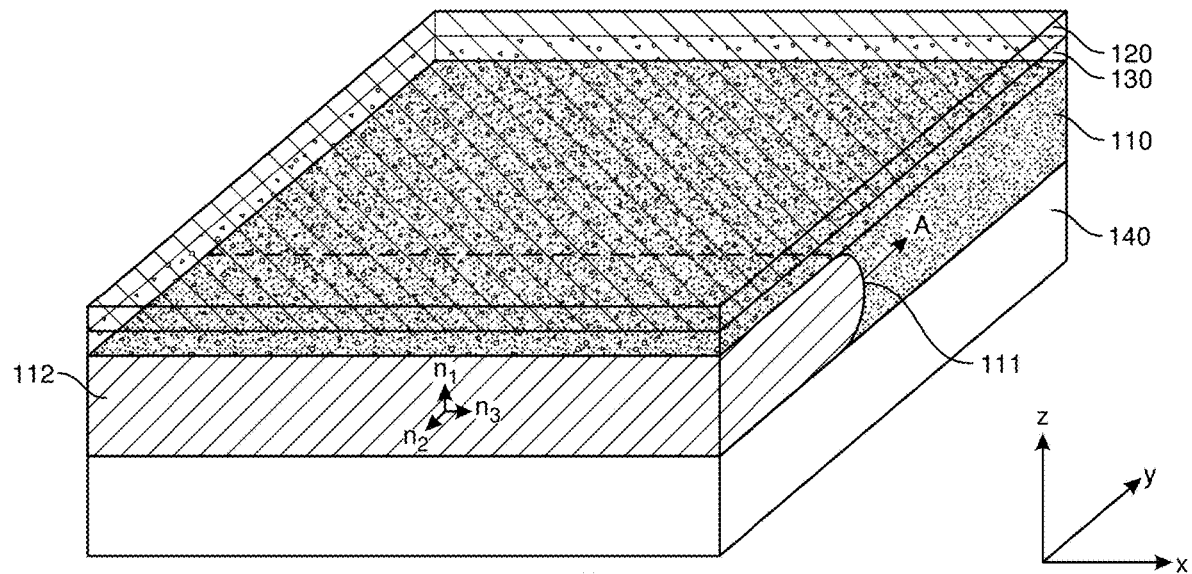

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the present disclosure covers all modifications, equivalents, and alternatives falling within the scope of the appended claims.

DETAILED DESCRIPTION OF EXEMPLARY EMBODIMENTS

Polymer and other organic materials may be incorporated into a variety of different optic and electro-optic device architectures, including passive and active optics and electroactive devices. Lightweight and conformable, one or more polymer/organic solid layers may be incorporated into wearable devices such as smart glasses and are attractive candidates for emerging technologies including virtual reality/augmented reality devices where a comfortable, adjustable form factor is desired.

Virtual reality (VR) and augmented reality (AR) eyewear devices or headsets, for instance, may enable users to experience events, such as interactions with people in a computer-generated simulation of a three-dimensional world or viewing data superimposed on a real-world view. By way of example, superimposing information onto a field of view may be achieved through an optical head-mounted display (OHMD) or by using embedded wireless glasses with a transparent heads-up display (HUD) or augmented reality (AR) overlay. VR/AR eyewear devices and headsets may be used for a variety of purposes. For example, governments may use such devices for military training, medical professionals may use such devices to simulate surgery, and engineers may use such devices as design visualization aids.

Notwithstanding recent developments, it would be advantageous to provide polymer and other organic solid materials having improved optical properties, including one or more of a controllable refractive index and birefringence, optical clarity, and optical transparency. Such materials may be formed into thin films, and a plurality of thin films may be stacked to form a multilayer.

A single OSC thin film or a multilayer thin film that includes plural layers of an organic solid crystal material may be incorporated into a variety of optical systems and devices. By way of example, an optical assembly, such as a lens system including a circular reflective polarizer, may include a multilayer organic solid crystal thin film. The multilayer thin film may include a plurality of rotationally-offset biaxially-oriented organic solid material layers. Each biaxial OSC layer may be characterized by three mutually orthogonal refractive indices ($n_1$, $n_2$, $n_3$) where $n_1 \neq n_2 \neq n_3$.

According to particular embodiments, a multilayer organic solid crystal thin film-based reflective polarizer may be incorporated into display systems to provide high broadband efficiency and high off-axis contrast. By mis-aligning (i.e., rotating) each layer with respect to an adjacent layer, such biaxially oriented multilayer thin films may enable higher signal efficiency and greater ghost image suppression than architectures using comparative materials. Organic solid crystal thin films can also be used in various projectors as a brightness enhancement layer.

One or more source materials may be used to form an organic solid crystal thin film, including a multilayer thin film. Example organic materials include various classes of crystallizable organic semiconductors. In accordance with various embodiments, organic semiconductors may include small molecules, macromolecules, liquid crystals, organometallic compounds, oligomers, and polymers. Organic semiconductors may include p-type, n-type, or ambipolar polycyclic aromatic hydrocarbons, such as anthracene, phenanthrene, tolane, thiophene, carbon 60, pyrene, corannulene, fluorene, biphenyl, ter-phenyl, etc. Example compounds may include cyclic, linear and/or branched structures, which may be saturated or unsaturated, and may additionally include heteroatoms and/or saturated or unsaturated heterocycles, such as furan, pyrrole, thiophene, pyridine, pyrimidine, piperidine, and the like. Heteroatoms may include fluorine, chlorine, nitrogen, oxygen, sulfur, phosphorus, as well as various metals. Suitable feedstock for molding solid organic semiconductor materials may include neat organic compositions, melts, solutions, or suspensions containing one or more of the organic materials disclosed herein.

Structurally, the disclosed organic materials, as well as the thin films derived therefrom, may be single crystal, polycrystalline, or glassy. Organic solid crystals may include closely packed structures (e.g., organic molecules) that exhibit desirable optical properties such as a high and tunable refractive index, and high birefringence. Anisotropic organic solid materials may include a preferred packing of molecules, i.e., a preferred orientation or alignment of molecules.

Such organic solid crystal (OSC) materials may provide functionalities, including phase modulation, beam steering, wave-front shaping and correction, optical communication, optical computation, holography, and the like. Due to their optical and mechanical properties, organic solid crystals may enable high-performance devices, and may be incorporated into passive or active optics, including AR/VR headsets, and may replace comparative material systems such as polymers, inorganic materials, and liquid crystals. In certain aspects, organic solid crystals may have optical properties that rival those of inorganic crystals while exhibiting the processability and electrical response of liquid crystals.

Due to their relatively low melting temperature, for instance, organic solid crystals may be molded to form a desired structure or article. Molding processes may enable complex architectures and may be more economical than the cutting, grinding, and polishing of bulk crystals. In addition, as disclosed further herein, a chemical additive may be integrated with a molding process to improve the surface roughness of a molded organic solid crystal in situ. In one example, a single crystal or polycrystalline basic shape such as a sheet or cube may be partially or fully melted into a desired form and then controllably cooled to form a single crystal having a new shape.

The present disclosure is thus generally directed to organic thin films and devices containing such thin films, and more particularly to organic solid crystal thin films and their methods of manufacture. Example devices may include one or more organic solid crystal thin film having a high refractive index that may be further characterized by a smooth exterior surface.

A process of molding an optically anisotropic crystalline or partially crystalline thin film may include operational control of the thermodynamics and kinetics of nucleation and crystal growth. In certain embodiments, a temperature during molding proximate to a nucleation region of a mold may be less than a melting onset temperature ($T_m$) of a molding feedstock, while the temperature remote from the nucleation region may be greater than the melting onset temperature. Such a temperature gradient paradigm may be obtained through a spatially applied thermal gradient, optionally in conjunction with a selective melting process (e.g., laser, soldering iron, etc.) to remove excess nuclei, leaving few nuclei (e.g., a single nucleus) for crystal growth.

To promote nucleation and crystal growth, a selected temperature and temperature gradient may be applied to a crystallization front of a nascent thin film. The temperature and temperature gradient proximate to the crystallization front may be determined based on the selected feedstock, including its melting temperature, thermal stability, and rheological attributes.

A suitable mold for molding an organic solid crystal thin film may be formed from a material having a softening temperature or a glass transition temperature ($T_g$) greater than the melting onset temperature ($T_m$) of the feedstock. The mold may include any suitable material, e.g., silicon, silicon dioxide, fused silica, quartz, glass, nickel, silicone, siloxanes, perfluoropolyethers, polytetrafluoroethylenes, perfluoroalkoxy alkanes, polyimide, polyethylene naphthalate, polyvinylidene fluoride, polyphenylene sulfide, and the like.

An epitaxial or non-epitaxial growth process may be used to form an organic solid crystal (OSC) layer over a suitable substrate or mold. A seed crystal for encouraging crystal nucleation and an anti-nucleation layer configured to locally inhibit nucleation may collectively promote the formation of a limited number of crystal nuclei within one or more specified location(s), which may in turn encourage the formation of larger organic solid crystals. In some embodiments, a nucleation-promoting layer or seed crystal may itself be configured as a thin film.

Example nucleation-promoting or seed materials may include one or more metallic or inorganic elements or compounds, such as Pt, Ag, Au, Al, Pb, indium tin oxide, $SiO_2$, and the like. Further example nucleation-promoting or seed crystal materials may include organic compounds, such as a polyimide, polyamide, polyurethane, polyurea, polythiolurethane, polyethylene, polysulfonate, polyolefin, as well as mixtures and combinations thereof. In some examples, a nucleation-promoting material may be configured as a textured or aligned layer, such as a rubbed polyimide or photoalignment layer, which may be configured to induce directionality or a preferred orientation to an over-formed organic solid crystal thin film.

An example method for manufacturing an organic solid crystal thin film includes providing a mold, forming a layer of a nucleation-promoting material over at least a portion of a surface of the mold, and depositing a layer of molten feedstock over the surface of the mold and in contact with the layer of the nucleation-promoting material, while maintaining a temperature gradient across the layer of the molten feedstock.

An anti-nucleation layer may include a dielectric material. In further embodiments, an anti-nucleation layer may include an amorphous material. In example processes, crystal nucleation may occur independent of the substrate or mold.

In some embodiments, a surface treatment or release layer disposed over the substrate or mold may be used to control nucleation and growth of the organic solid crystal (OSC) and later promote separation and harvesting of a bulk crystal or thin film. For instance, a coating having a solubility parameter mismatch with the feedstock may be applied to the substrate (e.g., globally or locally) to suppress interaction between the substrate and the crystallizing layer during the deposition process.

Example surface treatment coatings may include oleophobic coatings or hydrophobic coatings. A thin layer, e.g., monolayer or bilayer, of an oleophobic material or a hydrophobic material may be used to condition the substrate or mold prior to an epitaxial process. The coating material may be selected based on the substrate and/or the organic crystalline material. Further example surface treatment coating materials include siloxanes, fluorosiloxanes, phenyl siloxanes, fluorinated coatings, polyvinyl alcohol, and other OH bearing coatings, acrylics, polyurethanes, polyesters, polyimides, and the like.

In some embodiments, a release agent may be applied to an internal surface of the mold and/or combined with the feedstock. A surface treatment of an inner surface of the mold may include the chemical bonding or physical adsorption of small molecules, or polymers/oligomers having linear, branched, dendritic, or ringed structures, that may be functionalized or terminated, for example, with fluorinated groups, silicones, or hydrocarbon groups.

A buffer layer may be formed over the deposition surface of a substrate or mold. A buffer layer may include a small molecule that may be similar to or even equivalent to the small molecule forming the organic solid crystal, e.g., an anthracene single crystal. A buffer layer may be used to tune one or more properties of the deposition/growth surface of the substrate or mold, including surface energy, wettability, crystalline or molecular orientation, etc.

A further example method for manufacturing an organic solid crystal thin film includes forming a layer of a molecular feedstock over a surface of a mold, the molecular feedstock including crystallizable organic molecules, forming a selected number of crystal nuclei from the organic molecules within a nucleation region of the molecular feedstock layer, and growing the selected number of crystal nuclei to form an organic solid crystal thin film. In some embodiments, the selected number of crystal nuclei may be one. Crystal growth may be controlled using an isothermal process, slow cooling, and zone annealing.

In some embodiments, an additive may be used to encourage the growth of a single crystal and/or its release from the mold. In some embodiments, in addition to the precursor (i.e., crystallizable organic molecules) for the organic solid crystal, a molecular feedstock may include an additive selected from polymers, oligomers, and small molecules, where the additive may have a melting onset temperature of at least 20° C. less than a melting onset temperature of the organic solid crystal precursor, e.g., 20° C., 30° C., or even 40° C. less than the melting onset temperature of the feedstock. An additive may promote crystal growth and the formation of a large crystal size. In some embodiments, an additive may be integrated with a molding process to improve the characteristics of a molded organic solid crystal thin film, including its surface roughness.

During the act of molding, and in accordance with particular embodiments, a cover plate may be applied to a free surface of the organic solid crystal thin film. The cover plate may be oriented at an angle with respect to a major surface of the thin film. A force may be applied to the cover plate to generate capillary forces that facilitate mass transport of the molten feedstock, i.e., between the cover plate and the substrate and in the direction of a crystallization front of a growing crystalline thin film. In some embodiments, such as through vertical orientation of the deposition system, the force of gravity may contribute to mass transport and the delivery of molten feedstock to the crystallization front. Suitable materials for the cover plate and the substrate may independently include silicon dioxide, fused silica, high index glasses, high index inorganic crystals, and high melting temperature polymers (e.g., siloxanes, polyimides, PTFE, PFA, etc.), although further material compositions are contemplated.

According to particular embodiments, a method of forming an organic solid crystal (OSC) may include contacting an organic precursor (i.e., crystallizable organic molecules) with a non-volatile medium material, forming a layer including the organic precursor over a surface of a substrate or mold, and processing the organic precursor layer to form an organic crystalline phase, where the organic crystalline phase may include a preferred orientation of molecules.

The act of contacting the organic precursor with the non-volatile medium material may include forming a homogeneous mixture of the organic precursor and the non-volatile medium material. In further embodiments, the act of contacting the organic precursor with the non-volatile medium material may include forming a layer of the non-volatile medium material over a surface of a substrate or mold and forming a layer of the organic precursor over the layer of the non-volatile medium material.

According to further embodiments, a method may include forming a layer of a non-volatile medium material over a surface of a mold, forming a layer of a molecular feedstock over a surface of the non-volatile medium material, the molecular feedstock including an organic solid crystal precursor, forming crystal nuclei from the organic solid crystal precursor, and growing the crystal nuclei to form an organic solid crystal thin film.

In some embodiments, the non-volatile medium material may be disposed between the mold surface and the organic precursor and may be adapted to decrease the surface roughness of the molded organic solid crystal thin film and promote its release from the mold while locally inhibiting nucleation of a crystalline phase. Example non-volatile medium materials include liquids such as silicone oil, paraffin oil, fluorinated polymers, a polyolefin and/or polyethylene glycol. Thus, in some embodiments, a layer of a non-volatile medium material may provide a liquid surface for the growth of an organic solid crystal, such as an organic solid crystal thin film. Further example non-volatile medium materials may include crystalline materials having a melting temperature that is less than the melting temperature of the organic precursor material. In some embodiments the mold surface may be pre-treated in order to improve wetting and/or adhesion of the non-volatile medium material.

The substrate or mold may include a surface configured to provide a desired shape to the molded organic solid crystal thin film. For example, the substrate or mold surface may be planar, concave, or convex, and may include a three-dimensional architecture, such as surface relief gratings, or a curvature (e.g., compound curvature) configured to form microlenses, microprisms, or prismatic lenses. According to some embodiments, a substrate or mold geometry may be transferred and incorporated into a surface of an over-formed organic solid crystal thin film. For the sake of convenience, the terms "substrate" and "mold" may be used interchangeably herein unless the context indicates otherwise.

In some embodiments, the surface roughness of the substrate itself, i.e., a crystal growth surface, may be controlled to enable the formation of large (area) organic solid crystals. By decreasing the substrate surface roughness, the number of nucleation sites may be decreased, which may enable the formation of higher quality (i.e., optical quality) thin films. In addition, by decreasing the substrate surface roughness, a contact area between the substrate and the nascent solid crystal may be decreased, which may improve releasability.

According to some embodiments, an organic solid crystal thin film may be characterized by a preferred orientation of molecules that define a surface having a surface roughness ($R_a$) of less than approximately 10 micrometers over an area of at least approximately 1 cm$^2$. In some embodiments, at least one surface of an OSC thin film may have a surface roughness ($R_a$) of less than approximately 10000 nm, less than approximately 5000 nm, less than approximately 2000 nm, less than approximately 1000 nm, less than approximately 500 nm, less than approximately 200 nm, less than approximately 100 nm, less than approximately 50 nm, less than approximately 20 nm, less than approximately 10 nm, less than approximately 5 nm, or less than approximately 2 nm, including ranges between any of the foregoing values.

As used herein, the term "approximately" in reference to a particular numeric value or range of values may, in certain embodiments, mean and include the stated value as well as all values within 10% of the stated value. Thus, by way of example, reference to the numeric value "50" as "approximately 50" may, in certain embodiments, include values equal to 50±5, i.e., values within the range 45 to 55.

The deposition surface of a substrate or mold may include a functional layer that is configured to be transferred to the organic solid crystal after formation of the organic solid crystal and its separation from the substrate or mold. Functional layers may include an interference coating, an AR coating, a reflectivity enhancing coating, a bandpass coating, a band-block coating, blanket or patterned electrodes, etc. By way of example, an electrode may include any suitably electrically conductive material such as a metal, a transparent conductive oxide (TCO) (e.g., indium tin oxide or indium gallium zinc oxide), or a metal mesh or nanowire matrix (e.g., including metal nanowires or carbon nanotubes).

In lieu of, or in addition to, molding, further example deposition methods for forming organic solid crystals include vapor phase growth, solid state growth, melt-based growth, solution growth, etc., optionally in conjunction with a suitable substrate and/or seed crystal. A substrate may be organic or inorganic. By way of example, thin film solid organic materials may be manufactured using one or more processes selected from chemical vapor deposition and physical vapor deposition. Further coating processes, e.g., from solution, may include 3D printing, ink jet printing, gravure printing, doctor blading, spin coating, and the like. Such processes may induce shear during the act of coating and accordingly may contribute to crystallite or molecular alignment and a preferred orientation of crystallites and/or molecules within an organic solid crystal thin film. A still further example method may include pulling a free-standing crystal from a melt. According to some embodiments, solid-, liquid-, or gas-phase deposition processes may include epitaxial processes.

As used herein, the terms "epitaxy," "epitaxial" and/or "epitaxial growth and/or deposition" refer to the nucleation and growth of an organic solid crystal on a deposition surface (e.g., seed layer) where the organic solid crystal layer being grown assumes the same crystalline habit as the material of the deposition surface. For example, in an epitaxial deposition process, chemical reactants may be controlled, and the system parameters may be set so that depositing atoms or molecules alight on the deposition surface and remain sufficiently mobile via surface diffusion to orient themselves according to the crystalline orientation of the atoms or molecules of the deposition surface. An epitaxial process may be homogeneous or heterogeneous.

In accordance with various embodiments, the optical and electrooptical properties of an organic solid crystal thin film may be tuned using doping and related techniques. Doping may influence the polarizability of an organic solid crystal, for example. The introduction of dopants, i.e., impurities, into an organic solid crystal, may influence, for example, the highest occupied molecular orbital (HOMO) and lowest unoccupied molecular orbital (LUMO) bands and hence the band gap thereof, induced dipole moment, and/or molecular/crystal polarizability.

Doping may be performed in situ, i.e., during epitaxial growth, or following epitaxial growth, for example, using ion implantation or plasma doping. In exemplary embodiments, doping may be used to modify the electronic structure of an organic solid crystal without damaging molecular packing or the crystal structure itself. In this vein, a post-implantation annealing step may be used to heal crystal defects introduced during ion implantation or plasma doping. Annealing may include rapid thermal annealing or pulsed annealing, for example.

Doping changes the electron and hole carrier concentrations of a host material at thermal equilibrium. A doped organic solid crystal may be p-type or n-type. As used herein, "p-type" refers to the addition of impurities to an organic solid crystal that create a deficiency of valence electrons, whereas "n-type" refers to the addition of impurities that contribute free electrons to an organic solid crystal. Without wishing to be bound by theory, doping may influence "π-stacking" and "π-π interactions" within an organic solid crystal.

Example dopants include Lewis acids (electron acceptors) and Lewis bases (electron donors). Particular examples include charge-neutral and ionic species, e.g., Brønsted acids and Brønsted bases, which in conjunction with the aforementioned processes may be incorporated into an organic solid crystal by solution growth or co-deposition from the vapor phase. In particular embodiments, a dopant may include an organic molecule, an organic ion, an inorganic molecule, or an inorganic ion. A doping profile may be homogeneous or localized to a particular region (e.g., depth or area) of an organic solid crystal.

During nucleation and growth, the orientation of the in-plane axes of an OSC thin film may be controlled using one or more of substrate temperature, deposition pressure, solvent vapor pressure, or non-solvent vapor pressure. High refractive index and highly birefringent organic solid crystal thin films may be supported by a substrate or mold or removed therefrom to form a free-standing thin film. A substrate, if used, may be rigid or deformable.

Example processes may be integrated with a real-time feedback loop that is configured to assess one or more attributes of the organic solid crystal and accordingly adjust one or more process variables, including melt temperature, mold temperature, feedstock injection rate into a mold, etc.

Following deposition, an OSC material may be diced and polished to achieve a desired form factor and surface quality. Dicing may include diamond turning, for example, although other cutting methods may be used. Polishing may include chemical mechanical polishing. In some embodiments, a chemical or mechanical surface treatment may be used to create structures on a surface of an OSC thin film. Example surface treatment methods include diamond turning and photolithography and etch processes. In some embodiments, a cover plate or substrate with reciprocal structures may be used to fabricate surface structures in an OSC thin film.

An organic solid crystal thin film may include a surface that is planar, convex, or concave. In some embodiments, the surface may include a three-dimensional architecture, such as a periodic surface relief grating. In further embodiments, a thin film may be configured as a microlens or a prismatic lens. For instance, polarization optics may include a microlens that selectively focuses one polarization of light over another. In some embodiments, a structured surface may be formed in situ, i.e., during crystal growth of the organic solid crystal thin film over a suitably shaped mold. In further embodiments, a structured surface may be formed after crystal growth, e.g., using additive or subtractive processing, such as 3D printing or photolithography and etching. The nucleation and growth kinetics and choice of chemistry may be selected to produce a solid organic crystal thin film having areal (lateral) dimensions of at least approximately 1 cm.

The organic crystalline phase may be single crystal or polycrystalline. In some embodiments, the organic crystalline phase may include amorphous regions. In some embodiments, the organic crystalline phase may be substantially crystalline. The organic crystalline phase may be characterized by a refractive index along at least one principal axis of at least approximately 1.5 at 589 nm. By way of example, the refractive index of the organic crystalline phase at 589 nm and along at least one principal axis may be at least approximately 1.5, at least approximately 1.6, at least approximately 1.7, at least approximately 1.8, at least approximately 1.9, at least approximately 2.0, at least approximately 2.1, at least approximately 2.2, at least approximately 2.3, at least approximately 2.4, at least approximately 2.5, or at least approximately 2.6, including ranges between any of the foregoing values.

In some embodiments, the organic crystalline phase may be characterized by a birefringence ($\Delta n$), where $n_1 \neq n_2 \neq n_3$, of at least approximately 0.05, e.g., at least approximately 0.05, at least approximately 0.1, at least approximately 0.2, at least approximately 0.3, at least approximately 0.4, or at least approximately 0.5, including ranges between any of the foregoing values. In some embodiments, a birefringent organic crystalline phase may be characterized by a birefringence of less than approximately 0.05, e.g., less than approximately 0.05, less than approximately 0.02, less than approximately 0.01, less than approximately 0.005, less than approximately 0.002, or less than approximately 0.001, including ranges between any of the foregoing values.

Three axis ellipsometry data for example isotropic or anisotropic organic molecules are shown in Table 1. The data include predicted and measured refractive index values and birefringence values for 1,2,3-trichlorobenzene (1,2,3-TCB), 1,2-diphenylethyne (1,2-DPE), and phenazine. Shown are larger than anticipated refractive index values and birefringence compared to calculated values based on the HOMO-LUMO gap for each organic material composition.

TABLE 1

Index and Birefringence Data for Example Organic Semiconductors

| Organic Material | Predicted Index | Measured Index (589 nm) | | | Birefringence | | |
|---|---|---|---|---|---|---|---|
| | | nx | ny | nz | $\Delta n(xy)$ | $\Delta n(xz)$ | $\Delta n(yz)$ |
| 1,2,3-TCB | 1.567 | 1.67 | 1.76 | 1.85 | 0.09 | 0.18 | 0.09 |
| 1,2-DPE | 1.623 | 1.62 | 1.83 | 1.63 | 0.18 | 0.01 | 0.17 |
| phenazine | 1.74 | 1.76 | 1.84 | 1.97 | 0.08 | 0.21 | 0.13 |

Organic solid crystal thin films, including multilayer organic solid crystal thin films, may be optically transparent and exhibit low bulk haze. As used herein, a material or element that is "transparent" or "optically transparent" may, for a given thickness, have a transmissivity within the visible light spectrum of at least approximately 80%, e.g., approximately 80, 90, 95, 97, 98, 99, or 99.5%, including ranges between any of the foregoing values, and less than approximately 5% bulk haze, e.g., approximately 0.1, 0.2, 0.4, 1, 2, or 4% bulk haze, including ranges between any of the foregoing values. Transparent materials will typically exhibit very low optical absorption and minimal optical scattering.

As used herein, the terms "haze" and "clarity" may refer to an optical phenomenon associated with the transmission of light through a material, and may be attributed, for example, to the refraction of light within the material, e.g., due to secondary phases or porosity and/or the reflection of light from one or more surfaces of the material. As will be appreciated, haze may be associated with an amount of light that is subject to wide angle scattering (i.e., at an angle greater than 2.5° from normal) and a corresponding loss of transmissive contrast, whereas clarity may relate to an amount of light that is subject to narrow angle scattering (i.e., at an angle less than 2.5° from normal) and an attendant loss of optical sharpness or "see through quality."

In some embodiments, one or more organic solid crystal thin film layers may be stacked to form a multilayer. A multilayer thin film may be formed by clocking and stacking individual layers. That is, in an example "clocked" multilayer stack, an in-plane angle of refractive index misorientation between successive layers may range from approximately 1° to approximately 90°, e.g., 1, 2, 5, 10, 20, 30, 40, 45, 50, 60, 70, 80, or 90°, including ranges between any of the foregoing values.

In example multilayer architectures, the thickness of each layer may be determined from an average value of in-plane refractive indices ($n_2$ and $n_3$), where $(n_2+n_3)/2$ may be greater than approximately 1.5, e.g., greater than 1.5, greater than 1.55, or greater than 1.6. Generally, the thickness of a given layer may be inversely proportional to the arithmetic average of its in-plane indices. In a similar vein, the total number of layers in a multilayer stack may be determined from the in-plane birefringence ($|n_3-n_2|$), which may be greater than approximately 0.05, e.g., greater than 0.05, greater than 0.1, or greater than 0.2.

According to some embodiments, for a given biaxially-oriented organic solid material layer within a multilayer stack, the out-of-plane index ($n_1$) may be related to the in-plane refractive indices ($n_2$ and $n_3$) by the relationship $$n_1 = \frac{1}{2\pi}\int_0^{2\pi} \sqrt{(n_2\sin\varphi)^2 + (n_3\cos\varphi)^2}\, d\varphi,$$

where $\varphi$ represents a rotation angle of a refractive index vector between adjacent layers. The variation in $n_1$ may be less than ±0.7, less than ±0.6, less than ±0.5, less than ±0.4, less than ±0.3, or less than ±0.2.

Disclosed are organic solid crystals having an actively tunable refractive index and birefringence. Methods of manufacturing such organic solid crystals may enable control of their surface roughness independent of surface features (e.g., gratings, etc.) and may include the formation of an optical element therefrom, such as a circular reflective polarizer.

According to various embodiments, an optical element including an organic solid crystal (OSC) may be integrated into an optical component or device, such as an OFET, OPV, OLED, etc., and may be incorporated into a structure or a device such as a waveguide, Fresnel lens (e.g., a cylindrical Fresnel lens or a spherical Fresnel lens), grating, photonic integrated circuit, birefringent compensation layer, reflective polarizer, index matching layer (LED/OLED), and the like. In certain embodiments, grating architectures may be tunable along one, two, or three dimensions. Optical elements may include a single OSC layer or a multilayer OSC architecture.

As will be appreciated, one or more characteristics of organic solid crystals may be specifically tailored for a particular application. For many optical applications, for instance, it may be advantageous to control crystallite size, surface roughness, mechanical strength and toughness, and the orientation of crystallites and/or molecules within an organic solid crystal thin film. In a multilayer architecture, the composition, structure, and properties of each organic layer may be independently selected.

Organic solid crystals (e.g., OSC thin films) may be incorporated into passive and active optical waveguides, resonators, lasers, optical modulators, etc. Further example active optics include projectors and projection optics, ophthalmic high index lenses, eye-tracking, gradient-index optics, Pancharatnam-Berry phase (PBP) lenses, microlenses, pupil steering elements, optical computing, fiber optics, rewritable optical data storage, all-optical logic gates, multi-wavelength optical data processing, optical transistors, etc. According to further embodiments, organic solid crystals (e.g., OSC thin films) may be incorporated into passive optics, such as waveguides, reflective polarizers, refractive/diffractive lenses, and the like. Related optical elements for passive optics may include waveguides, polarization selective gratings, Fresnel lenses, microlenses, geometric lenses, PBP lenses, and multilayer thin films.

Features from any of the embodiments described herein may be used in combination with one another in accordance with the general principles described herein. These and other embodiments, features, and advantages will be more fully understood upon reading the following detailed description in conjunction with the accompanying drawings and claims.

The following will provide, with reference to FIGS. 1-23, detailed descriptions of organic solid crystals, their methods of manufacture, and potential applications. The discussion associated with FIG. 1 relates to example mold-based processes for forming an organic solid crystal thin film. The discussion associated with FIG. 2 relates to the structure and properties of example organic solid crystals. The discussion associated with FIGS. 3-9 includes a description of example epitaxial and non-epitaxial growth processes for forming organic solid crystals. The discussion associated with FIGS. 10-12 includes a description of 1D and 2D structured organic solid crystals. The discussion associated with FIGS. 13-17 includes a description of example manufacturing methods and apparatus for forming organic solid crystal thin films.

Figure 18:
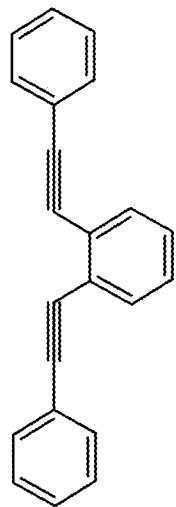
FIG. 18 shows example crystallizable organic molecules for manufacturing an organic solid crystal according to certain embodiments.
Figure 18:
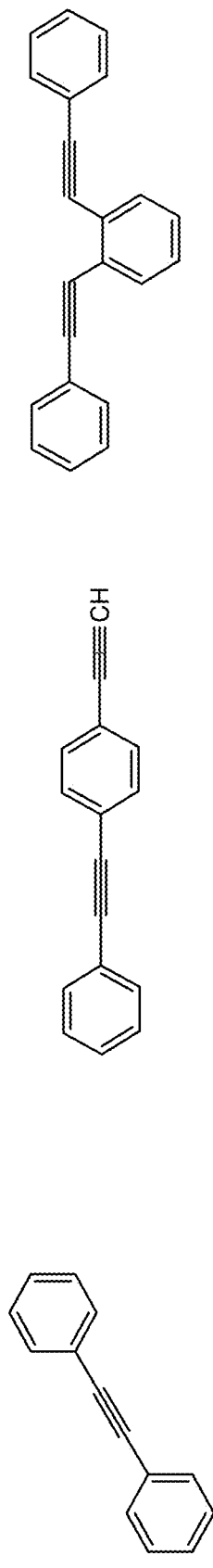
Figure 18:
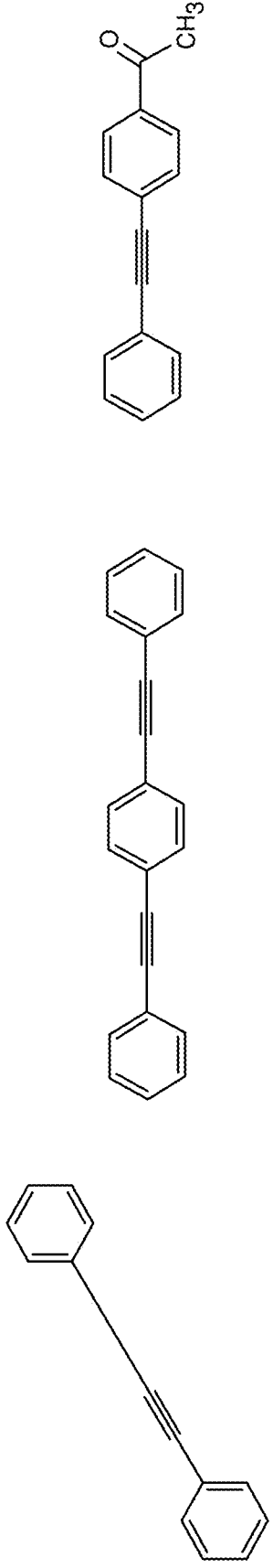
Figure 18:
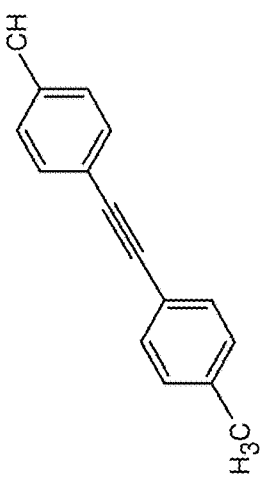
Figure 18:
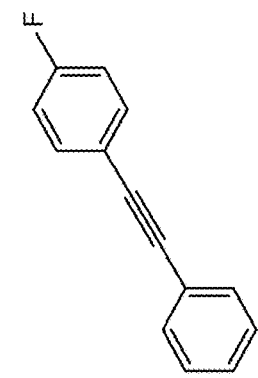
Figure 18:
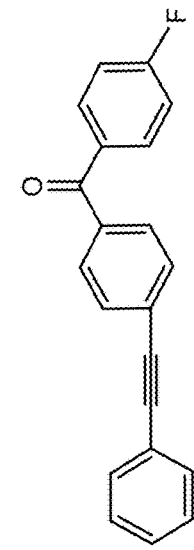
Figure 18:
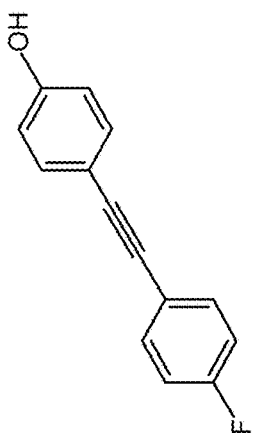
Figure 18:
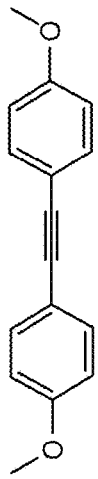
Figure 18:
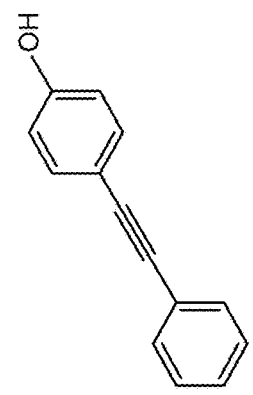
Figure 18:
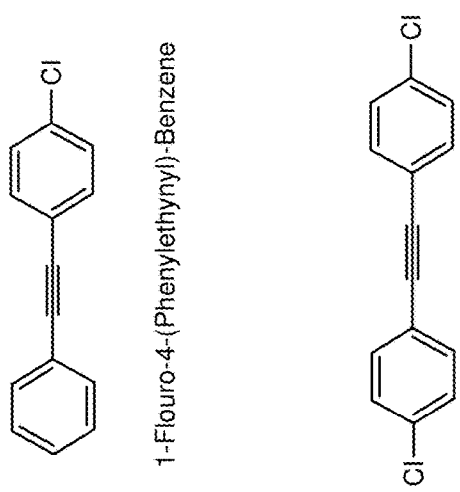
Figure 18:
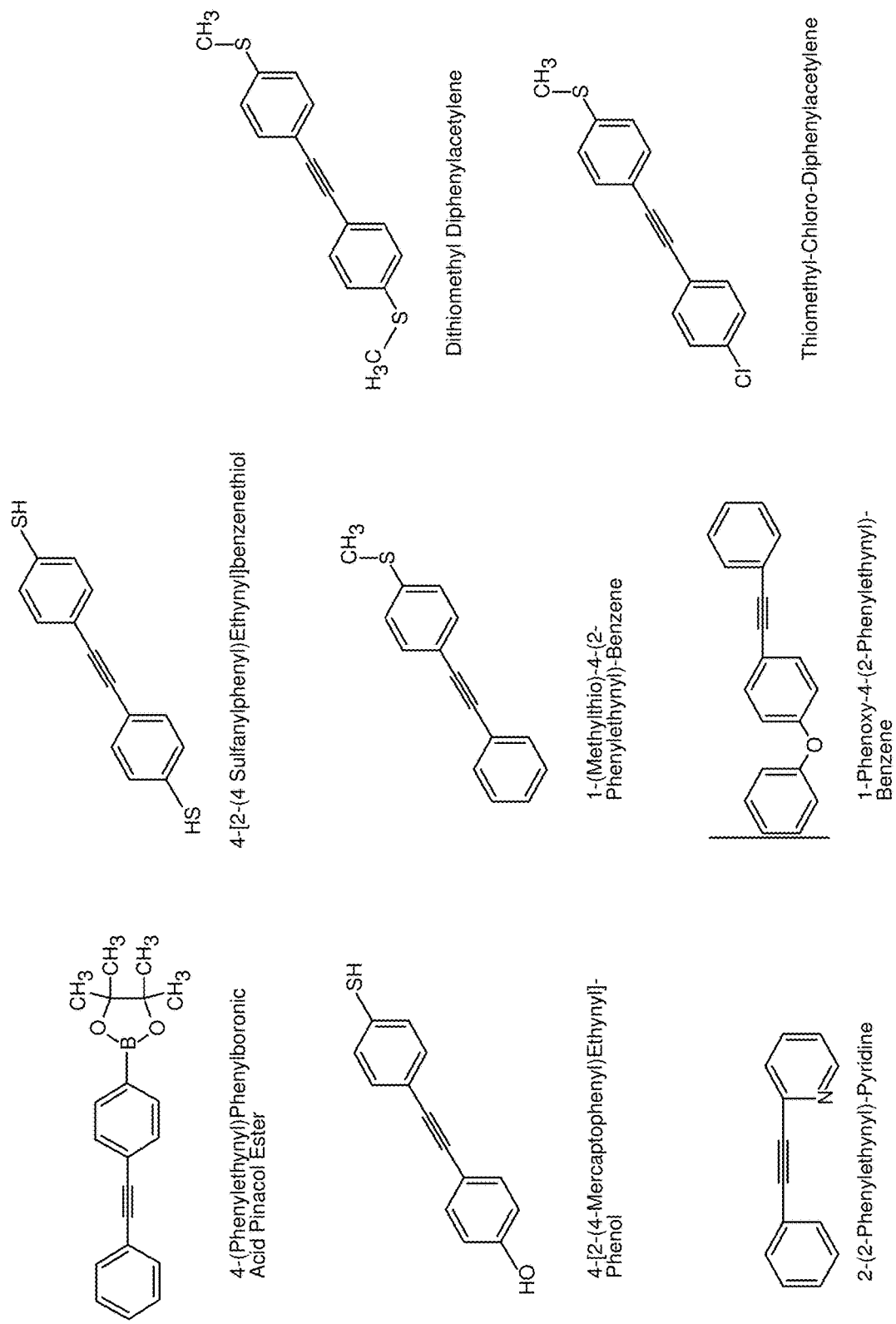

The discussion associated with FIG. 18 includes a description of example crystallizable organic molecules suitable for the manufacture of organic solid crystal (OSC) thin films. The discussion associated with FIG. 19 includes a description of a circular reflective polarizer that may include a multilayer organic solid crystal thin film having a biaxial refractive index. The discussion associated with FIG. 20 includes a description of the orientation of an in-plane refractive index ($n_3$) in an example multilayer organic solid crystal thin film. The discussion associated with FIG. 21 includes a description of the performance of an example circular reflective polarizer that includes a multilayer organic solid crystal thin film having a biaxial refractive index. The discussion associated with FIGS. 22 and 23 relates to exemplary virtual reality and augmented reality devices that may include one or more organic solid crystal thin films as disclosed herein.

Turning to FIG. 1, shown schematically are example manufacturing architectures that may be implemented in accordance with certain methods of forming an organic solid crystal thin film. In some embodiments, a layer of a crystallizable organic precursor 110 may be deposited over a surface of a mold 120 or between mold surfaces and processed to form an organic solid crystal thin film 112.

Referring to FIG. 1A, shown at an intermediate stage of fabrication, the organic precursor layer 110 may be disposed between upper and lower mold bodies 120, which may be respectively coated with upper and lower layers of a non-volatile medium material 130. The non-volatile medium material layer 130 may include an anti-nucleation layer. Following processing to induce nucleation and growth of the organic solid crystal, the resulting organic solid crystal thin film 112 may be removed from the mold 120. The organic solid crystal thin film 112 may be birefringent (e.g., $n_1 \neq n_2 \neq n_3$) and may be characterized by a high refractive index (e.g., $n_2 > 1.5$ and/or $n_3 > 1.5$).

Referring to FIG. 1B, shown is a further manufacturing architecture for forming a supported organic solid crystal thin film. In the architecture of FIG. 1B, at an intermediate stage of fabrication, a crystallizable organic precursor layer 110 may be disposed over a substrate 140. An upper mold body 120 may overlie the organic precursor layer 110, and a non-volatile medium material layer 130 may be located between the mold 120 and the organic precursor layer 110.

The layer of non-volatile medium material 130 may directly overlie the organic precursor layer 110 and may be configured to control the surface roughness of an upper surface of the organic solid crystal thin film 112 during crystal growth. In accordance with some embodiments, in FIG. 1A and FIG. 1B, the direction of movement of a crystallization front 111 during crystal growth is denoted with an arrow A.

Figure 2:
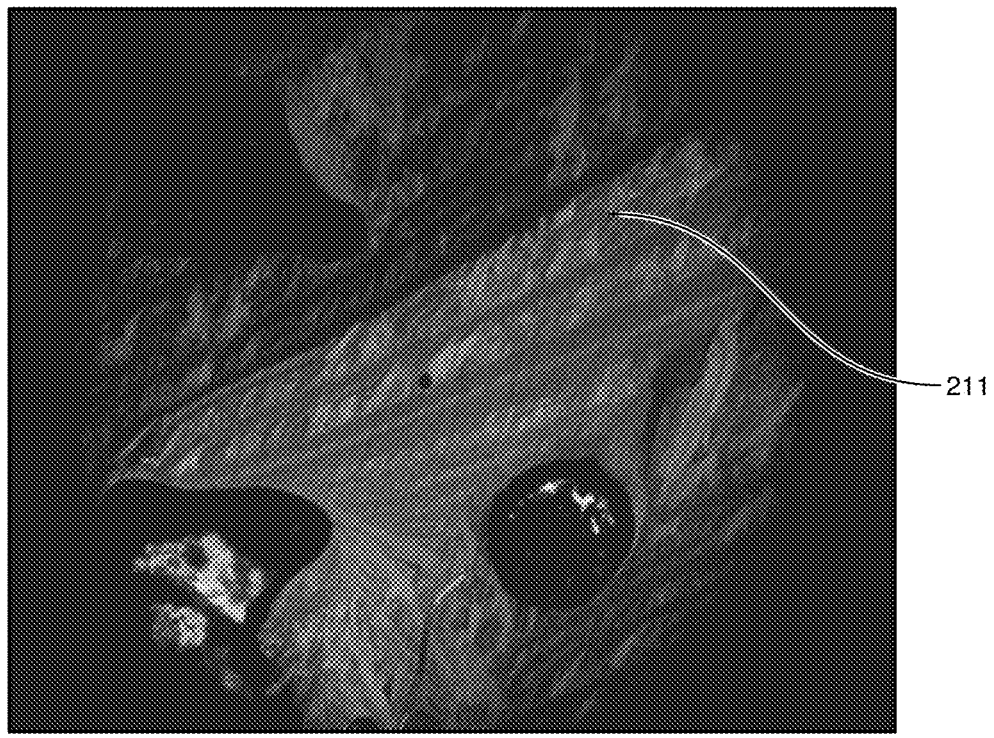
FIG. 2 shows cross-polarized microscope images of an organic solid crystal thin film manufactured (A) without a non-volatile medium material and (B) with a non-volatile medium material according to some embodiments.
Figure 2:

Referring to FIG. 2, shown are polarized optical microscope images of organic solid crystal thin films formed according to a mold-based method. The thin films 211, 212 were manufactured (A) without using a non-volatile medium material, and (B) with a layer of non-volatile medium material pre-disposed over a surface of the mold (for example, using a method illustrated in FIG. 1A or FIG. 1B). The improved surface morphology associated with use of the non-volatile medium material layer is evident in the appearance of organic solid crystal thin film 212 in FIG. 2B.

Figure 3:
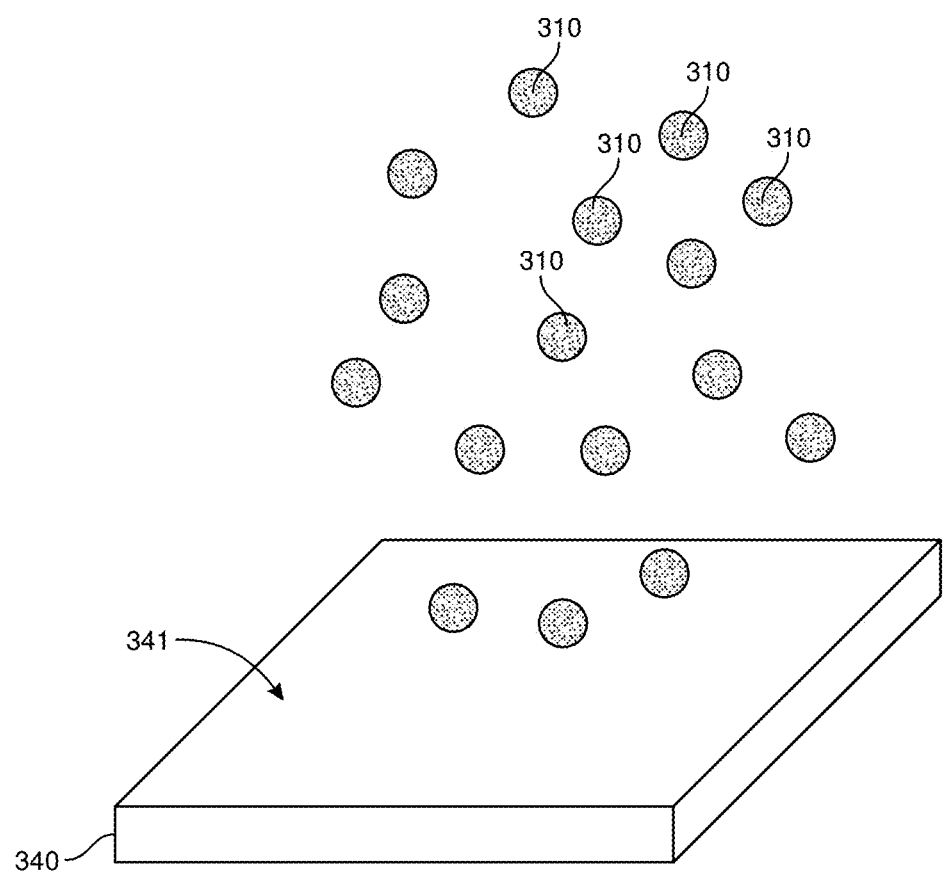
FIG. 3 is a schematic representation of a vapor deposition-based epitaxial growth process for forming organic solid crystals according to some embodiments.

An example vapor phase epitaxial growth process for forming an organic solid crystal thin film is illustrated schematically in FIG. 3. Vaporized molecules 310 of an organic solid crystal material may be directed, e.g., within a vacuum chamber (not shown), to a deposition surface 341 of a substrate 340 to form a layer of an organic solid crystal over the substrate. The choice of solvent, concentration of the vaporized molecules, substrate temperature, temperature gradient(s), gas pressure, etc. may be used to control the gas phase mobility of the molecules 310, the adsorption and desorption rates of the molecules 310, and the crystallization rate and crystal structure of the organic solid crystal thin film.

Figure 4:
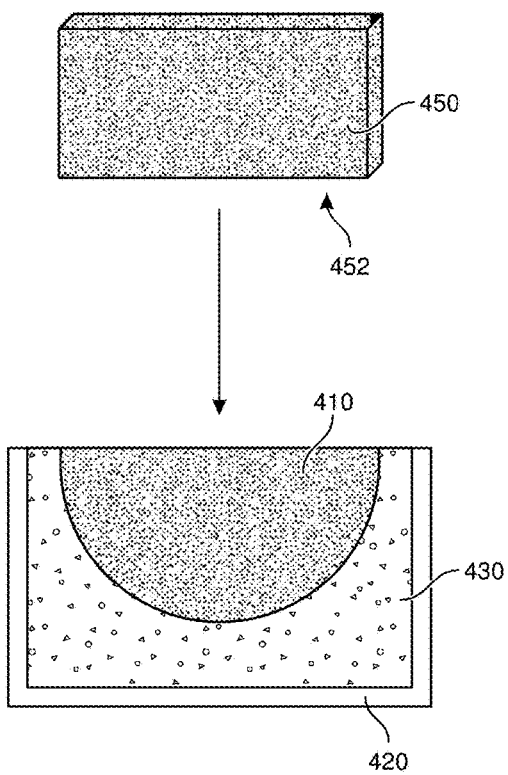
FIG. 4 is a schematic representation of a melt-based epitaxial growth process for forming organic solid crystals according to some embodiments.

A further example epitaxial growth process for forming an organic solid crystal is illustrated schematically in FIG. 4. In the method of FIG. 4, an organic crystal melt 410 may be contained and heated within a mold 420. The mold 420 may be formed from a glass or glass ceramic material, for example. The organic crystal melt 410 may be directly in contact with a non-volatile medium material 430 contained by the mold 420. The non-volatile medium material 430 may include silicone oil, paraffin oil, a fluorinated polymer or fluorinated oligomer, polyethylene glycol, polyolefin, and the like.

A seed crystal 450 may be contacted with the organic crystal melt 410 and drawn from the melt phase at a desired rate, e.g., under continuous operation, to form an organic solid crystal. The seed crystal 450 may include an organic solid crystal material. In some embodiments, the composition of the organic crystal melt 410 and the composition of the seed crystal 450 may be equivalent or substantially equivalent. The seed crystal 450 may have a planar or non-planar contact surface 452 that contacts the melt phase, which may be chosen to control the curvature of an over-formed organic solid crystal. In some embodiments, organic crystal melt 410 may crystallize within mold 420 to form an organic solid crystal.

Figure 5:
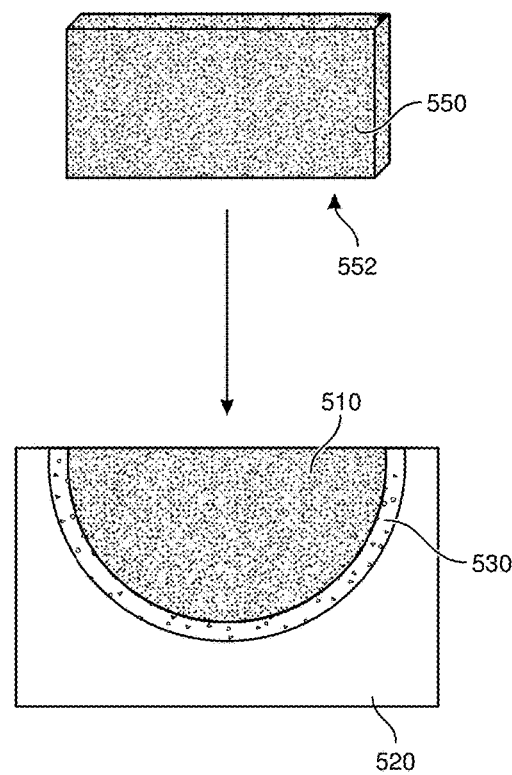
FIG. 5 is a schematic representation of a melt-based epitaxial growth process for forming organic solid crystals according to further embodiments.

A still further example epitaxial growth process and process architecture for forming an organic solid crystal is illustrated schematically in FIG. 5. In the method of FIG. 5, an organic crystal melt 510 may be contained and heated within a mold 520. The mold 520 may be configured to provide mechanical support and may include, for example, a glass or glass ceramic material. The organic crystal melt 510 may be directly in contact with a layer of a non-volatile medium material 530 overlying an inner surface of the mold 520. The non-volatile medium material 530 may include silicone oil, paraffin oil, a fluorinated polymer or fluorinated oligomer, polyethylene glycol, polyolefin, and the like. In the illustrated embodiment, the non-volatile medium material layer 530 may include a conformal layer of free-standing molecules (e.g., an oil or a brushed layer of a polymer, oligomer, or small molecules (e.g., silane or a fluorinated polymer).

Seed crystal 550 may be contacted with the organic crystal melt 510 and drawn from the melt phase at a desired rate, e.g., under continuous operation, to form an organic solid crystal. The seed crystal 550 may include an organic solid crystal material. In some embodiments, the organic crystal melt 510 and the seed crystal 550 may be compositionally equivalent or substantially equivalent. In some embodiments, the seed crystal 550 may have a planar or non-planar contact surface 552, which may be chosen to control the curvature of an over-formed organic solid crystal. In some embodiments, organic crystal melt 510 may crystallize within mold 520 to form an organic solid crystal.

In the embodiments of FIG. 4 and FIG. 5, the atmosphere overlying the melt phase may be controlled. For instance, the atmosphere overlying the melt may contain an inert gas such as argon that is maintained under a controlled pressure and/or flow rate.

Figure 6:
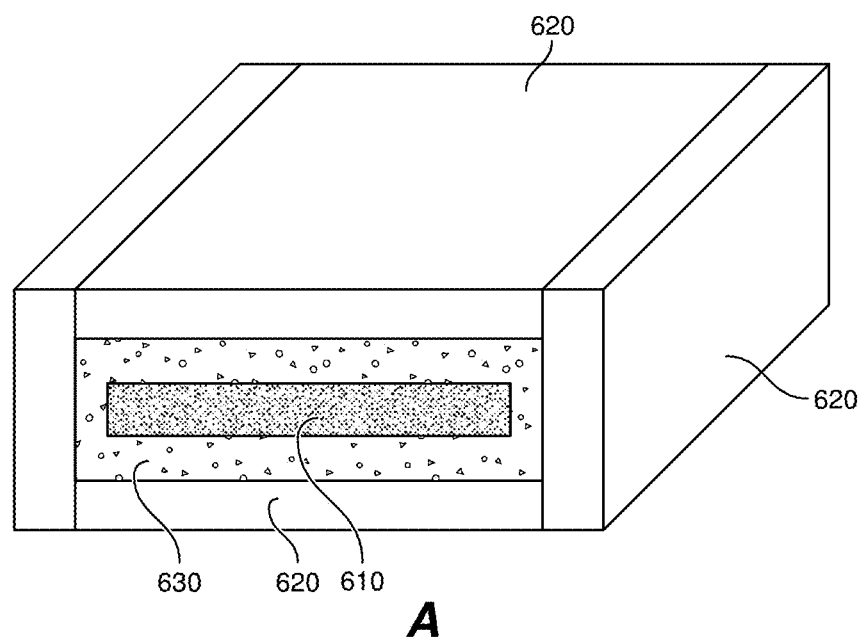
FIG. 6 shows (A) double-sided mold and (B) single-side mold epitaxial growth processes for forming organic solid crystals according to further embodiments.
Figure 6:
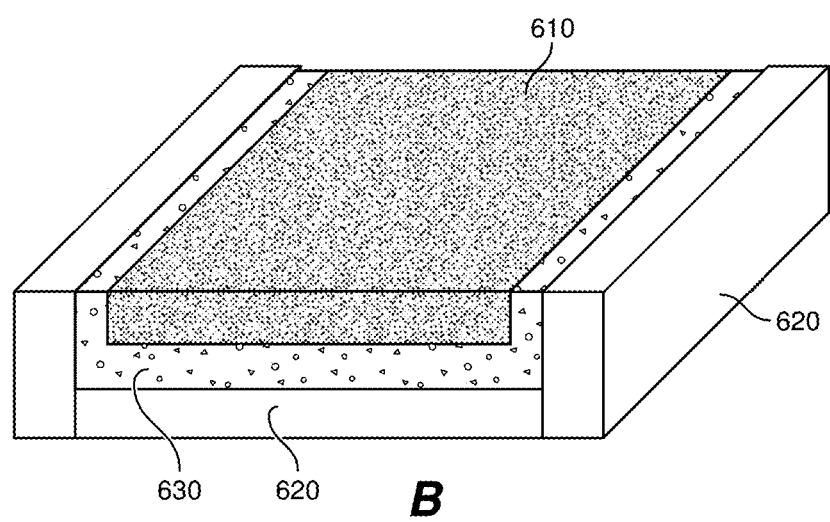
Figure 7:
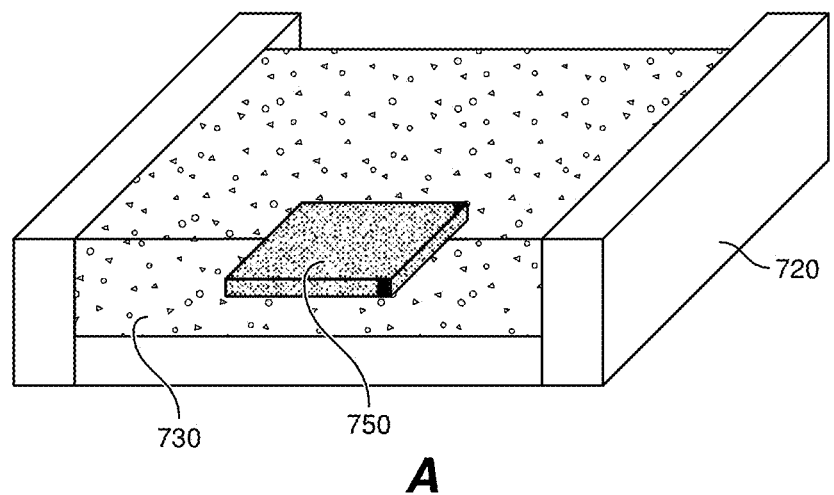
FIG. 7 shows a seeded single-side mold epitaxial growth process for forming organic solid crystals according to some embodiments.
Figure 7:
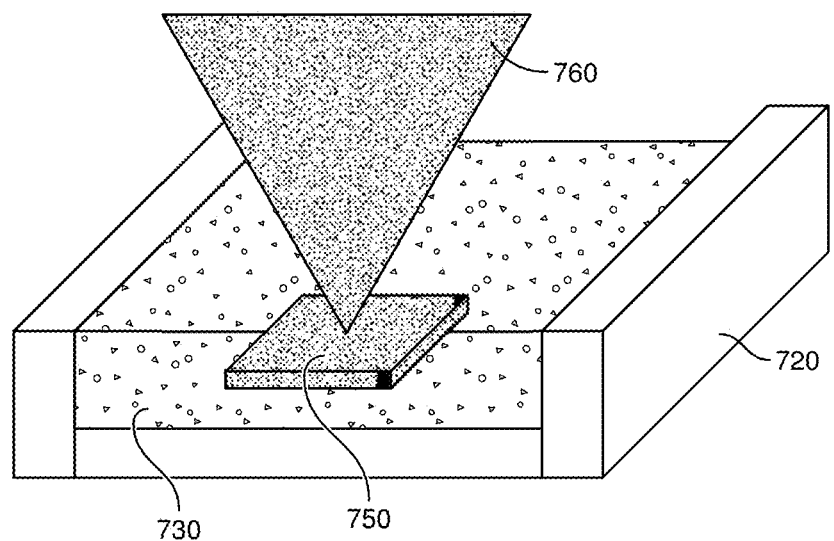

An example molding process architecture for forming an organic solid crystal is shown in FIG. 6, where both (A) a double-sided mold, and (B) a single-side mold architecture are illustrated. In each approach, a layer of a non-volatile medium material (i.e., anti-nucleation layer) 630 may be disposed between the mold 620 and the melt phase 610. A localized seed layer (not shown) may be used to initiate crystal nucleation and growth. A cut-away illustration of the single-side mold approach of FIG. 6B is shown in FIG. 7. In FIG. 7A, shown is a seed crystal 750 located within mold 720 and in contact with an anti-nucleation layer 730. Referring to FIG. 7B, a dispensing element 760 may be configured to deliver organic crystal molecules to a nucleation site proximate to the seed crystal 750, and subsequently to a crystallization front during crystal growth.

Figure 8:
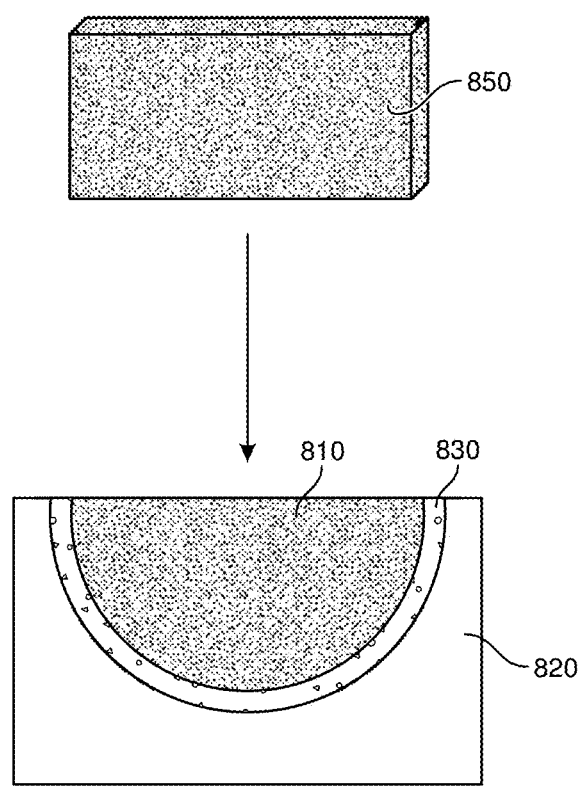
FIG. 8 is a schematic illustration of a solvent-based epitaxial/non-epitaxial growth process for forming organic solid crystals according to some embodiments.

Referring to FIG. 8, shown is a schematic set-up for an epitaxial or non-epitaxial growth process where an organic crystal seed 850 may be brought into contact with, and drawn from, a super saturated organic solution 810. The organic solution may include one or more crystallizable organic molecules dissolved in a suitable solvent. The organic solution 810 may be contained within mold 820 and separated from the mold 820 by an anti-nucleation layer 830.

Figure 9:
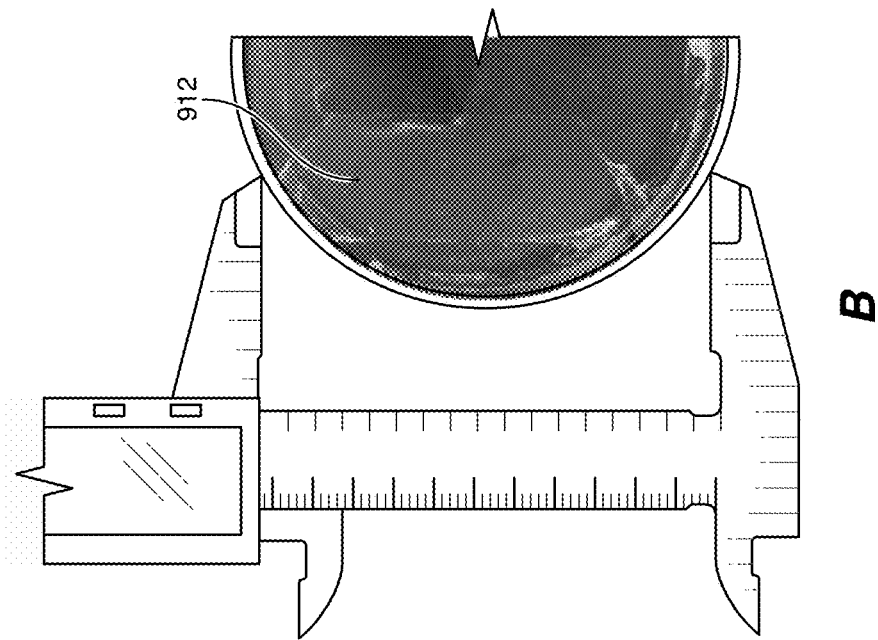
FIG. 9 is a schematic illustration of a non-epitaxial growth process for forming organic solid crystals according to certain embodiments.
Figure 9:
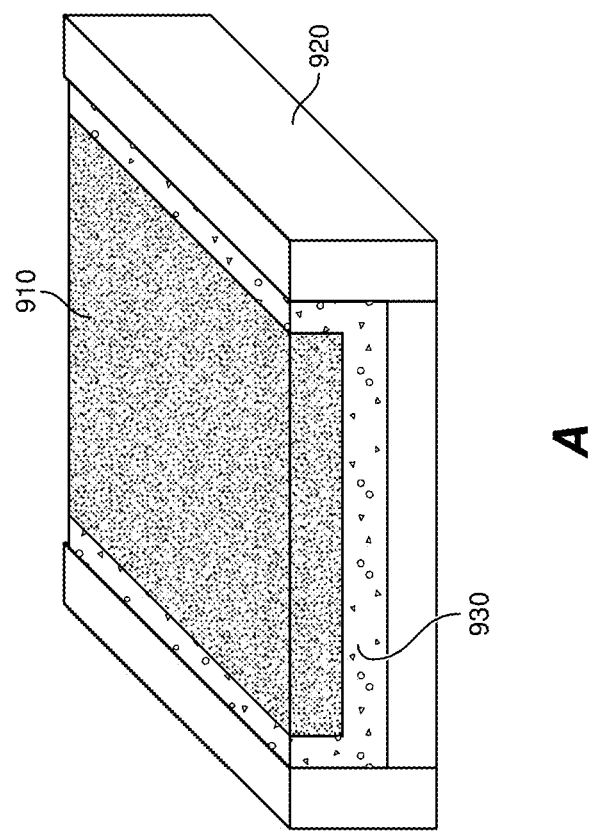

Referring to FIG. 9, a further nucleation and growth process may include providing an anti-nucleation layer 930 over a substrate 920 and introducing an organic crystal solution 910 over the anti-nucleation layer 930. As shown in FIG. 9A, optionally in the absence of a seed layer, the organic crystal solution 910 may solidify to form an organic solid crystal. A photomicrograph of a free-standing organic solid crystal 912 is shown in FIG. 9B. According to some embodiments, the organic solid crystal 912 may be characterized by a length dimension of at least approximately 1 cm.

Figure 10:
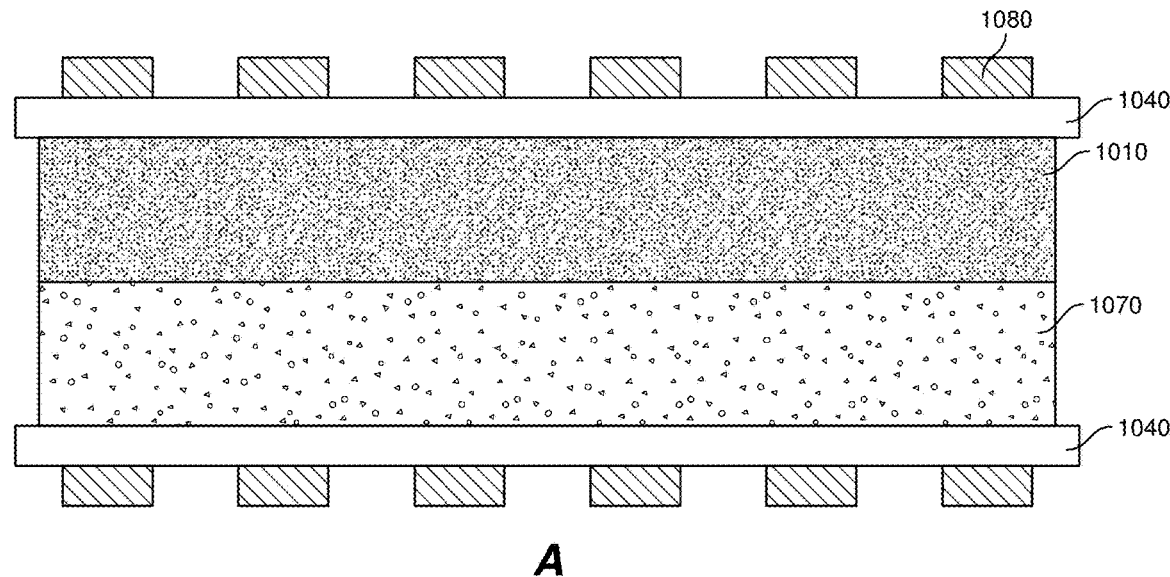
FIG. 10 illustrates an example organic solid crystal-containing architecture according to some embodiments.
Figure 10:
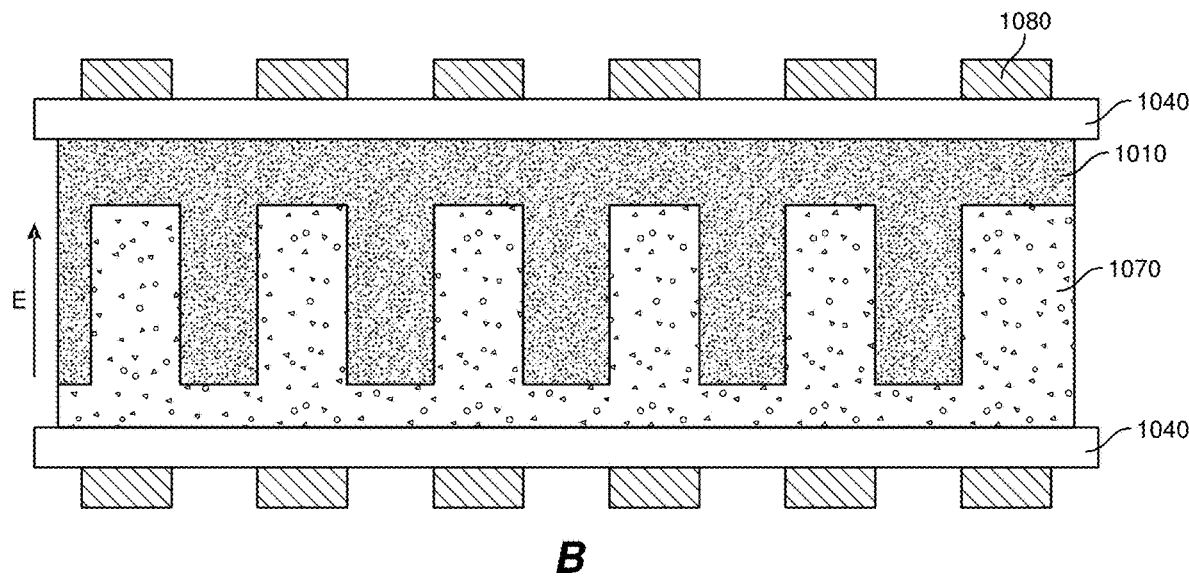
Figure 11:
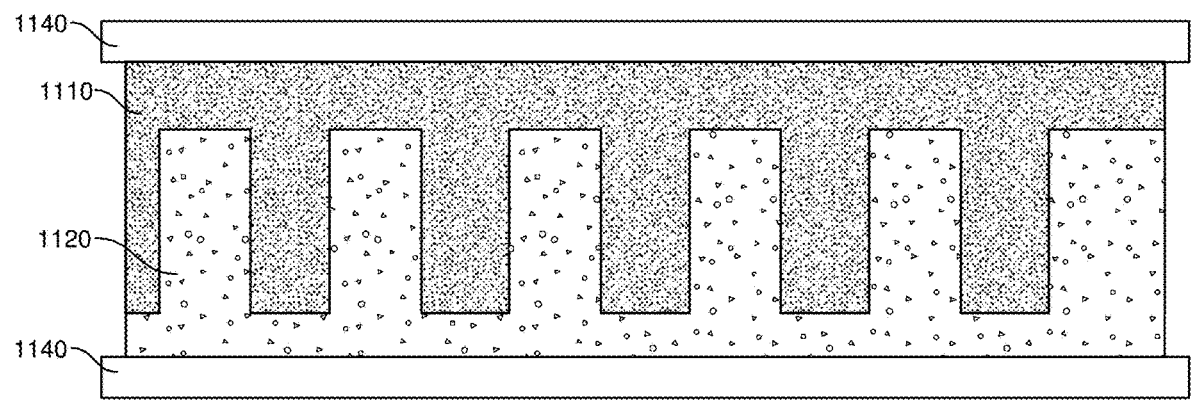
FIG. 11 illustrates an example organic solid crystal-containing architecture according to further embodiments.

According to further embodiments, dynamic and static methods for forming an organic solid crystal having structured surface features are shown schematically in FIGS. 10 and 11. Referring initially to FIG. 10A, a layer of an organic crystal solution or melt 1010 and an adjacent layer of an electrically conductive liquid 1070 may be disposed between opposing substrates 1040. Patterned and paired electrodes 1080 may overlie the respective substrates 1040. Referring to FIG. 10B, under an applied electric field (E), a pattern may be induced in the electrically conductive liquid layer 1070, which may create a reciprocal pattern in the organic crystal material layer 1010. In turn, crystallization of the organic crystal material layer 1010 may be carried out by thermally-induced nucleation and growth, for example, optionally in conjunction with a seed crystal (not shown) to form an organic solid crystal thin film having periodic surface features or structures, such as an array of raised elements.

Referring to FIG. 11, shown is a static approach to forming an organic solid crystal having structured surface features. A layer of an organic crystal solution or melt 1110 and an adjacent pre-patterned mold 1120 may be disposed between opposing substrates 1140. With the organic crystal solution or melt 1110 conforming to the shape of the patterned mold 1120, crystallization of the organic crystal material layer 1110 may be carried out by thermally-induced nucleation and growth to form an organic solid crystal thin film having periodic surface features.

Such structured organic solid crystal thin films may form or be incorporated into a variety of optical elements, including gratings, micro lenses, prismatic lenses, Fresnel lenses, and the like.

Figure 12:
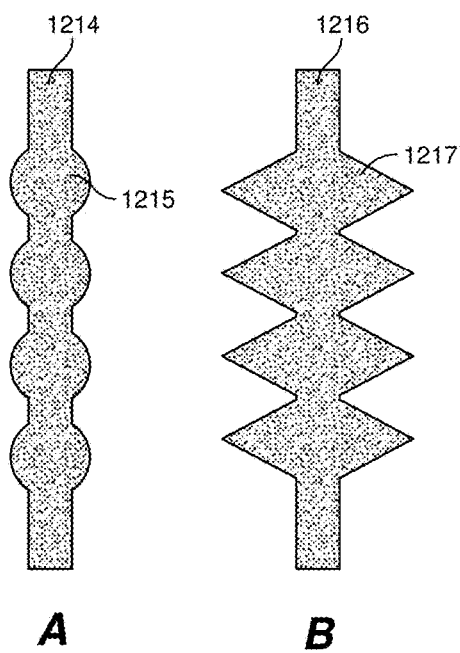
FIG. 12 illustrates example organic solid crystal geometries according to some embodiments.

According to further embodiments, a schematic view of example organic solid crystal structures formed by drawing from a melt phase are shown in FIG. 12. The organic solid crystal 1214 depicted in FIG. 12A and the organic solid crystal 1216 depicted in FIG. 12B may include respective surface features, such as nodules 1215 or facets 1217, for example. One or more process variables, including draw rate from the melt, pressure, and temperature may be controlled to create a desired surface pattern.

Figure 13:
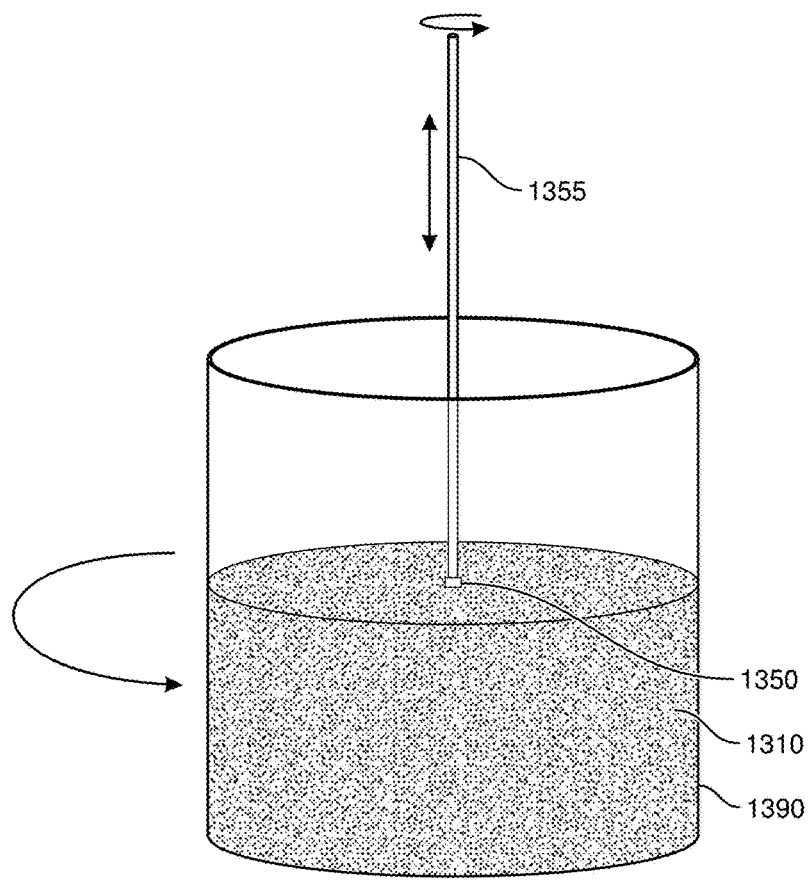
FIG. 13 is a schematic illustration of an example crystal growth apparatus for manufacturing an organic solid crystal according to various embodiments.

Referring to FIG. 13, shown is a perspective view of an example melt-based deposition method and apparatus for forming an organic solid crystal from molten feedstock. Molten feedstock 1310 may be contained by reservoir 1390. Reservoir 1390 may be formed from a glass or glass ceramic composition, for example, and may include an internal passivation layer (not shown) to suppress nucleation. A seed crystal 1350 may be mounted at a distal end of a rotatable and translatable rod 1355, such that the seed crystal 1350 may be lowered into the molten feedstock 1310 and withdrawn therefrom. A control system (not shown) may be configured to control one or more of the melt temperature, seed temperature, gas pressure and gas composition overlying the melt, rotation rate of the molten feedstock, rotation rate and draw rate of the seed crystal, etc.

Figure 14:
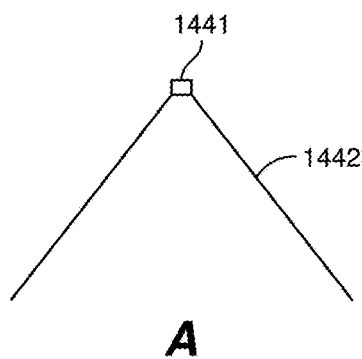
FIG. 14 is an illustration of example nucleation surface and scaffold geometries according to certain embodiments.
Figure 14:
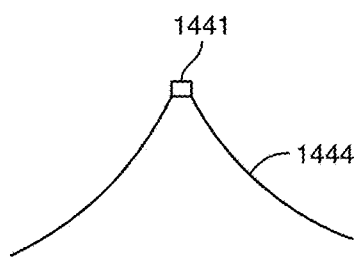

Referring to FIG. 14, according to various embodiments, located proximate to a seed crystal and a corresponding nucleation region, a crystal growth scaffold may be configured to template the growth of a desirably-shaped organic solid crystal. As shown in FIG. 14A, adjacent to nucleation region 1441, a planar scaffold 1442 may support the crystal growth of an organic solid crystal having a planar surface. As shown in FIG. 14B, adjacent to nucleation region 1441, a concave scaffold 1444 may support the crystal growth of an organic solid crystal having a convex outer surface. In some embodiments, plural seed crystals and plural associated scaffolds may be arrayed to form multiple nucleation sites from which several nuclei may grow and merge into larger crystals.

Top down plan views and cross-sectional views of example manufacturing architectures and methods for forming organic solid crystal thin films according to further embodiments are shown in FIG. 15 and FIG. 16. FIGS. 15A and 15B relate to a thin film forming architecture having a substrate 1540 and a single seed crystal 1550 disposed over the substrate 1540, whereas FIGS. 16A and 16B relate to a thin film forming architecture having a substrate 1640 and plural seed layers 1650 disposed over the substrate 1640. A layer of a crystallizable organic precursor 1510, 1610 may be deposited over a respective substrate 1540, 1640 and over respective seed crystal(s) 1550, 1650.

An organic solid crystal thin film 1512, 1612 may be formed by zone annealing using a suitable temperature profile ($T_1$, $T_2$, $T_3$). An example thermal profile is shown in FIG. 16B, where an organic solid crystal layer 1612 may nucleate proximate to seed crystal 1650. The direction of movement of a crystallization front 1511, 1611 during crystal growth is denoted in FIGS. 15B and 16B with an arrow A.

Figure 17:
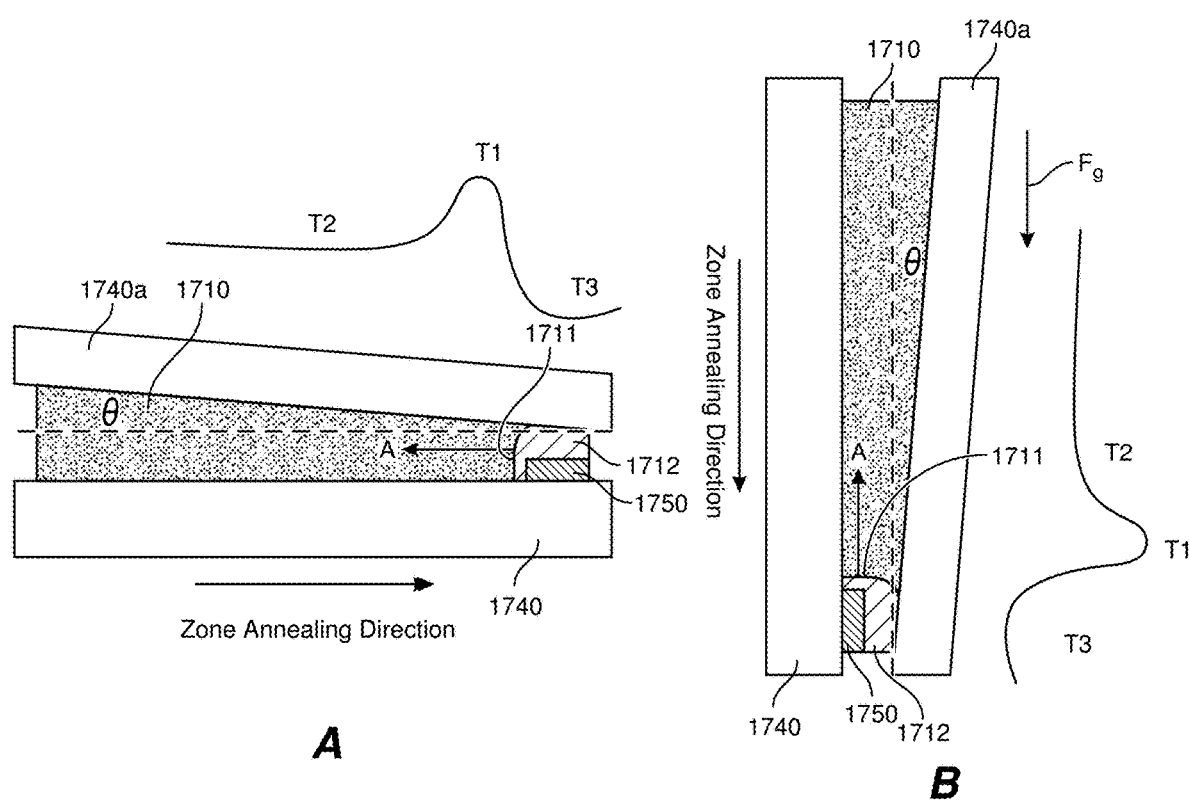
FIG. 17 is an illustration showing an OSC thin film manufacturing configuration for facilitating mass transport to a crystallization front during crystal growth according to some embodiments.

A further thin film forming architecture is shown in FIG. 17. Referring to FIG. 17A, a thin film forming architecture includes a substrate 1740 and a seed crystal 1750 disposed over the substrate 1740. A layer of a crystallizable organic precursor 1710 may be deposited over the substrate 1740 and over the seed crystal 1750. Application of a suitable thermal gradient ($T_1$, $T_2$, $T_3$) may induce nucleation and growth of an organic solid crystal thin film 1712. The thin film forming architecture may be translated relative to the thermal profile to advance a crystallization front 1711 and increase the area of the organic solid crystal thin film 1712 through crystal growth.

A cover plate 1740a may overlie the crystallizable organic precursor layer 1710. The cover plate 1740a may be oriented at an angle (θ) relative to the substrate 1740 and may be configured to generate capillary forces that improve mass transport of the molten feedstock to a region containing the crystallization front 1711. Referring to FIG. 17B, the apparatus of FIG. 17A may be oriented vertically. In the vertical orientation of FIG. 17B, in addition to or in lieu of capillary forces, gravitational forces ($F_g$) may advantageously promote mass transfer of the molten feedstock 1710 to the crystallization front 1711.

Example OSC materials suitable for forming a feedstock composition include small molecules, macromolecules, liquid crystals, organometallic compounds, oligomers, and polymers, and may include organic semiconductors such as polycyclic aromatic compounds, e.g., anthracene, phenanthrene, and the like. Methods of manufacturing organic solid crystals may include crystal growth from a melt or solution, chemical or physical vapor deposition, and solvent coating onto a substrate. A deposition surface of the substrate may be treated globally or locally to impact, for example, nucleation density, crystalline orientation, adhesion, etc. The foregoing methods may be applied in conjunction with one or more optional post-deposition steps, such as annealing, polishing, dicing, etc., which may be carried out to improve one or more OSC attributes, including crystallinity, thickness, curvature, and the like. Example organic molecules that may be used to form an organic solid crystal are shown in FIG. 18.

Figure 19:
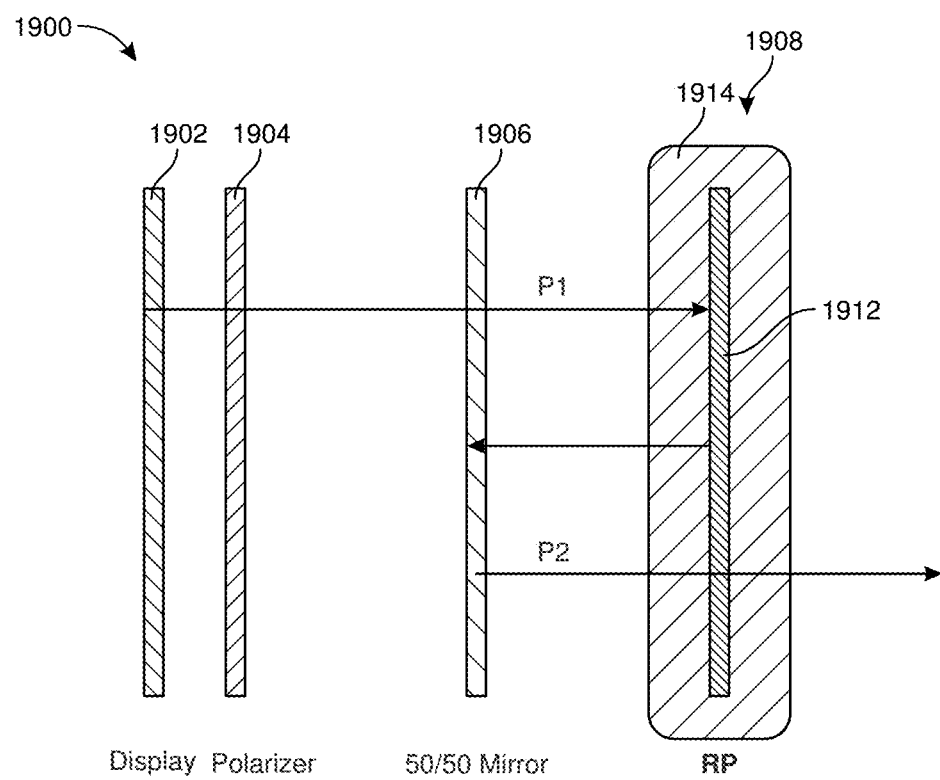
FIG. 19 is a cross-sectional schematic illustration of an optical element including a reflective organic solid crystal-containing polarizer according to some embodiments.

Referring to FIG. 19, shown is a cross-sectional view of an example optical element. Arranged in optical alignment, optical element 1900 may include a display 1902, a polarizer 1904, a 50/50 mirror 1906, and a circular reflective polarizer 1908. The circular reflective polarizer 1908 may include a multilayer organic solid crystal thin film 1912 optically encapsulated by a protective layer 1914. The multilayer organic solid crystal thin film 1912 may include a clocked and stacked configuration of multiple organic solid crystal thin films (not separately shown). The multilayer organic solid crystal thin film 1912 may be configured to reflect a first polarization of incident light (P1) and transmit a second polarization of incident light (P2)

Figure 20:
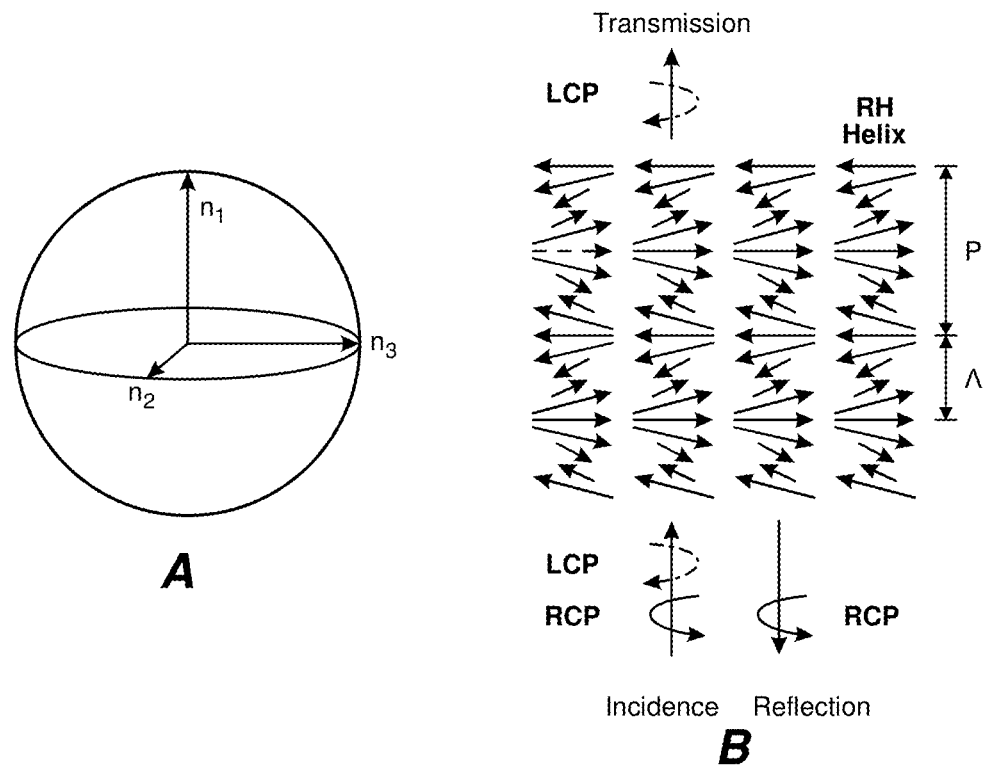
FIG. 20 is a graphic representation of the orientation of the major in-plane index ($n_3$) in a biaxial multilayer organic solid crystal thin film according to various embodiments.

Turning to FIG. 20, shown is both the architecture and the operation of an example circular reflective polarizer. The circular reflective polarizer may include a multilayer organic solid crystal thin film where each OSC layer in the multilayer stack includes a biaxially-oriented organic solid crystal material (i.e., $n_1 \neq n_2 \neq n_3$), as shown schematically in FIG. 20A. The multilayer may be characterized by a pitch length (P), which may correspond to two periods (2A) of index change.

In FIG. 20B, the plurality of arrows represent the orientation of a refractive index vector (e.g., $n_3$) in each OSC layer of the multilayer. In the illustrated embodiment of FIG. 20B, the right-handed (RH) circular reflective polarizer transmits light having left-hand circular polarization (LCP) and reflects light having right-hand circular polarization (RCP).

Figure 21:
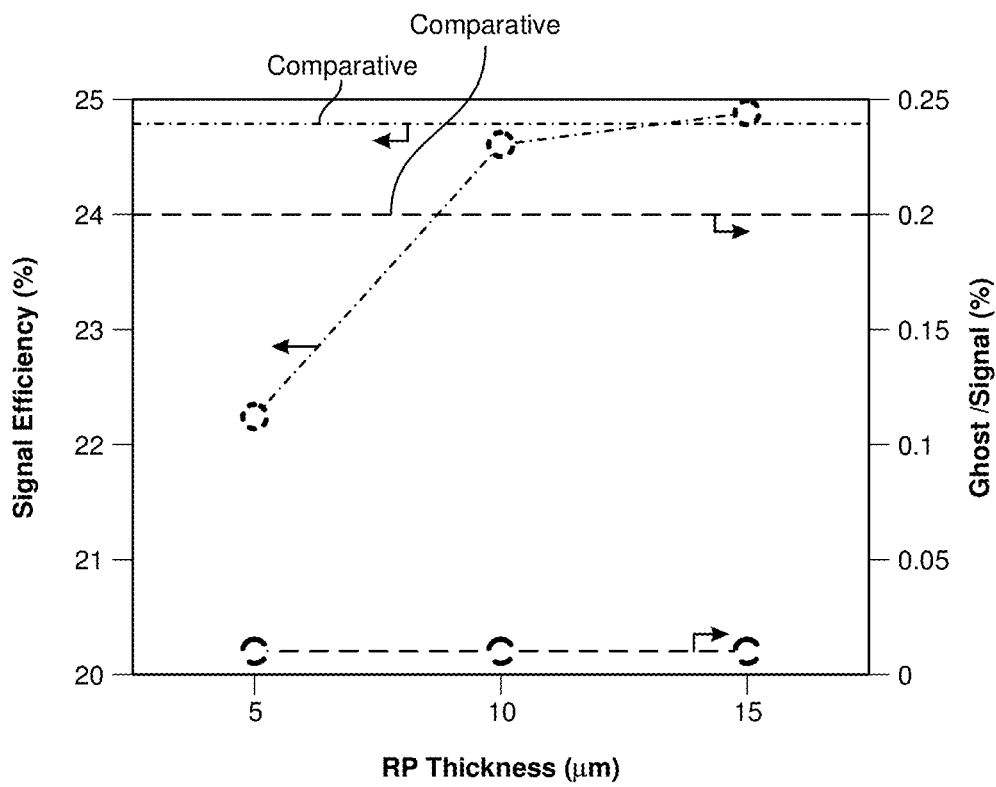
FIG. 21 is a plot of signal efficiency and ghost image suppression as a function of reflective polarizer thickness for a reflective polarizer including a biaxially oriented organic solid material according to some embodiments.

A plot of signal efficiency and ghost-to-signal ratio versus reflective polarizer thickness is shown in FIG. 21, and shows that a reflective polarizer including multiple clocked and stacked OSC thin films each having a biaxial refractive index may have higher signal efficiency and improved ghost suppression relative to comparative reflective polarizers.

As disclosed herein, a multilayer thin film includes stacked layers of biaxially-oriented organic solid materials. Each biaxially-oriented layer has three principal indices, where $n_1 \neq n_2 \neq n_3$. By rotating each layer against its adjacent layers, the biaxial multilayer presents greater signal efficiency and ghost image suppression than comparative architectures. Example organic solid materials include crystalline (e.g., single crystal), partially crystalline, or amorphous materials such as anisotropic glasses. The layers within a multilayer thin film may be formed using a physical vapor transport (PVT) or molding process, although other deposition methods are contemplated.

Disclosed are methods for forming an organic solid crystal thin film. In particular embodiments, the methods may be used to control the surface roughness of the thin film without the need for post-formation slicing, grinding, and polishing steps. Using a seed crystal to nucleate an organic solid crystal from a liquid phase containing an organic precursor, in an example method, an organic solid crystal thin film may be cast or molded using a non-volatile medium material (e.g., oil) to template crystal growth. Vapor phase and solid phase nucleation and growth paradigms are also disclosed. In some embodiments, an anti-nucleation layer or surface may be used to locally discourage crystallization and enable large area crystals. In some embodiments, a substrate surface may include a photoalignment layer. In particular examples, a substrate surface may be chemically treated to encourage a desired molecular alignment of an over-formed organic solid crystal.

In some embodiments, an organic precursor may be deposited directly over a layer of a non-volatile medium material, which may provide a smooth interface for the formation of the organic solid crystal thin film. Thermal processing may be used to induce nucleation and growth of the organic solid crystal phase.

In further embodiments, a mixture containing an organic precursor and a non-volatile medium material may be deposited over a substrate. If provided, a substrate may be patterned to include a 3D structure that is incorporated into the over-formed thin film. In a similar vein, a functional layer may be formed over the deposition surface of a substrate or mold and transferred to an over-formed organic solid crystal upon separation of the organic solid crystal from the substrate or mold. Thermal processing may be used to induce homogeneous mixing, and subsequent phase separation of the organic precursor and the non-volatile medium material, as well as nucleation and growth of the organic solid crystal phase. During nucleation and growth, according to various embodiments, at least one surface of the thin film may directly contact the non-volatile medium material, which may be effective to mediate molecular-level surface roughness of the nascent organic crystal(s).

In some embodiments, an organic solid crystal thin film may include an organic crystalline phase and may be characterized by a refractive index of at least approximately 1.5 at 589 nm, and a surface roughness (e.g., over an area of at least 1 cm$^2$ and independent of surface features such as gratings, etc.) of less than approximately 10 micrometers. The organic solid crystal thin film may be single crystal and may be characterized by three mutually orthogonal refractive indices. Further advantages of the disclosed methods may include improved processability and lower cost relative to alternate methods.

Example processes may be integrated with a real-time feedback loop that is configured to assess one or more attributes of the organic solid crystal thin film and accordingly adjust one or more process variables. Resultant organic solid crystal structures may be incorporated into optical elements such as AR/VR headsets and other devices, e.g., waveguides, prisms, Fresnel lenses, and the like.

Example Embodiments

Example 1: A method includes forming a layer of a non-volatile medium material over a surface of a mold, forming a layer of a molecular feedstock over a surface of the non-volatile medium material, the molecular feedstock including an organic solid crystal precursor, forming crystal nuclei from the organic solid crystal precursor, and growing the crystal nuclei to form an organic solid crystal thin film.

Example 2: The method of Example 1, where the non-volatile medium material includes a liquid selected from silicone oil, paraffin oil, a fluorinated polymer, a polyolefin and polyethylene glycol.

Example 3: The method of any of Examples 1 and 2, where the molecular feedstock includes a process enhancer selected from polymers, oligomers, and small molecules, the process enhancer having a melting onset temperature of at least approximately 20° C. less than a melting onset temperature of the organic solid crystal precursor.

Example 4: The method of any of Examples 1-3, where the organic solid crystal precursor includes a crystallizable organic molecule.

Example 5: The method of any of Examples 1-4, where forming the layer of molecular feedstock includes injecting the molecular feedstock into the mold.

Example 6: The method of any of Examples 1-5, where the crystal nuclei are formed within a nucleation region of the layer of the molecular feedstock.

Example 7: The method of Example 6, where forming the crystal nuclei includes heating the layer of the molecular feedstock to a temperature less than a melting onset temperature of the organic solid crystal precursor within the nucleation region.

Example 8: The method of any of Examples 6 and 7, where forming the crystal nuclei includes melting selected crystal nuclei outside of the nucleation region.

Example 9: The method of any of Examples 1-8, further including separating the organic solid crystal thin film from the surface of the non-volatile medium material.

Example 10: A thin film including a biaxially-oriented organic solid crystal layer having mutually orthogonal refractive indices, $n_1 \neq n_2 \neq n_3$.

Example 11: The thin film of Example 10, where the biaxially-oriented organic solid crystal layer includes a single crystal.

Example 12: The thin film of any of Examples 10 and 11, where in-plane refractive indices ($n_2$, $n_3$) of the biaxially-oriented organic solid crystal layer are related according to $(n_2+n_3)/2>1.5$.

Example 13: The thin film of any of Examples 10-12, where in-plane refractive indices ($n_2$, $n_3$) of the biaxially-oriented organic solid crystal layer are related according to $|n_2-n_3|>0.05$.

Example 14: The thin film of any of Examples 10-13, where an out-of-plane refractive index ($n_1$) of the biaxially-oriented organic solid crystal layer is related to in-plane refractive indices ($n_2$, $n_3$) of the biaxially-oriented organic solid crystal layer according to $$n_1 = \frac{1}{2\pi}\int_0^{2\pi} \sqrt{(n_2\sin\varphi)^2 + (n_3\cos\varphi)^2}\, d\varphi.$$

Example 15: The thin film of any of Examples 10-14, where a major surface of the thin film includes a periodic array of structures.

Example 16: An optical element including the thin film of any of Examples 10-15, where the optical element includes a passive component selected from a waveguide substrate, a grating, a microlens, a prismatic lens, a Fresnel lens, a reflective polarizer, a Pancharatnam-Berry phase (PBP) lens, an ophthalmic lens, and a photonic integrated circuit.

Example 14: An optical element including the thin film of any of Examples 10-15, where the optical element includes an active component selected from a phase modulator, a photonic integrated circuit, a polarization modulator, and an amplitude modulator.

Example 18: A method includes providing a layer of a non-volatile medium material, forming a layer of a molecular feedstock over a surface of the non-volatile medium material, the molecular feedstock including an organic solid crystal precursor, forming crystal nuclei from the organic solid crystal precursor within a nucleation region of the layer of the molecular feedstock, and growing the crystal nuclei to form an organic solid crystal thin film.

Example 19: The method of Example 18, where the organic solid crystal precursor includes a crystallizable organic molecule.

Example 20: The method of any of Examples 18 and 19, where forming the crystal nuclei includes heating the layer of the molecular feedstock to a temperature less than a melting onset temperature of the organic solid crystal precursor within the nucleation region.

Embodiments of the present disclosure may include or be implemented in conjunction with various types of artificial-reality systems. Artificial reality is a form of reality that has been adjusted in some manner before presentation to a user, which may include, for example, a virtual reality, an augmented reality, a mixed reality, a hybrid reality, or some combination and/or derivative thereof. Artificial-reality content may include completely computer-generated content or computer-generated content combined with captured (e.g., real-world) content. The artificial-reality content may include video, audio, haptic feedback, or some combination thereof, any of which may be presented in a single channel or in multiple channels (such as stereo video that produces a three-dimensional (3D) effect to the viewer). Additionally, in some embodiments, artificial reality may also be associated with applications, products, accessories, services, or some combination thereof, that are used to, for example, create content in an artificial reality and/or are otherwise used in (e.g., to perform activities in) an artificial reality.

Artificial-reality systems may be implemented in a variety of different form factors and configurations. Some artificial-reality systems may be designed to work without near-eye displays (NEDs). Other artificial-reality systems may include an NED that also provides visibility into the real world (e.g., augmented-reality system 2200 in FIG. 22) or that visually immerses a user in an artificial reality (e.g., virtual-reality system 2300 in FIG. 23). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Figure 22:
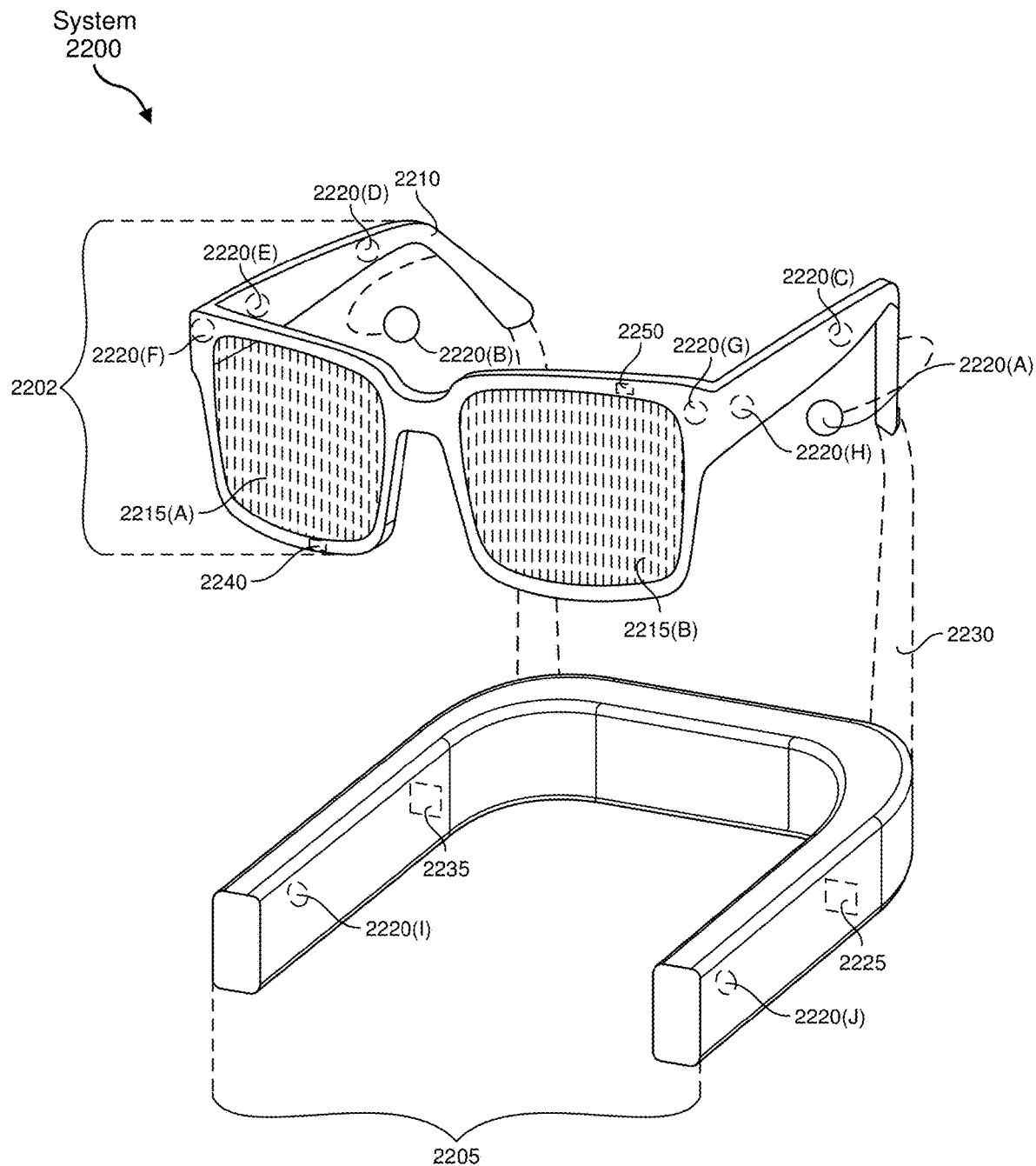
FIG. 22 is an illustration of exemplary augmented-reality glasses that may be used in connection with embodiments of this disclosure.
Figure 23:
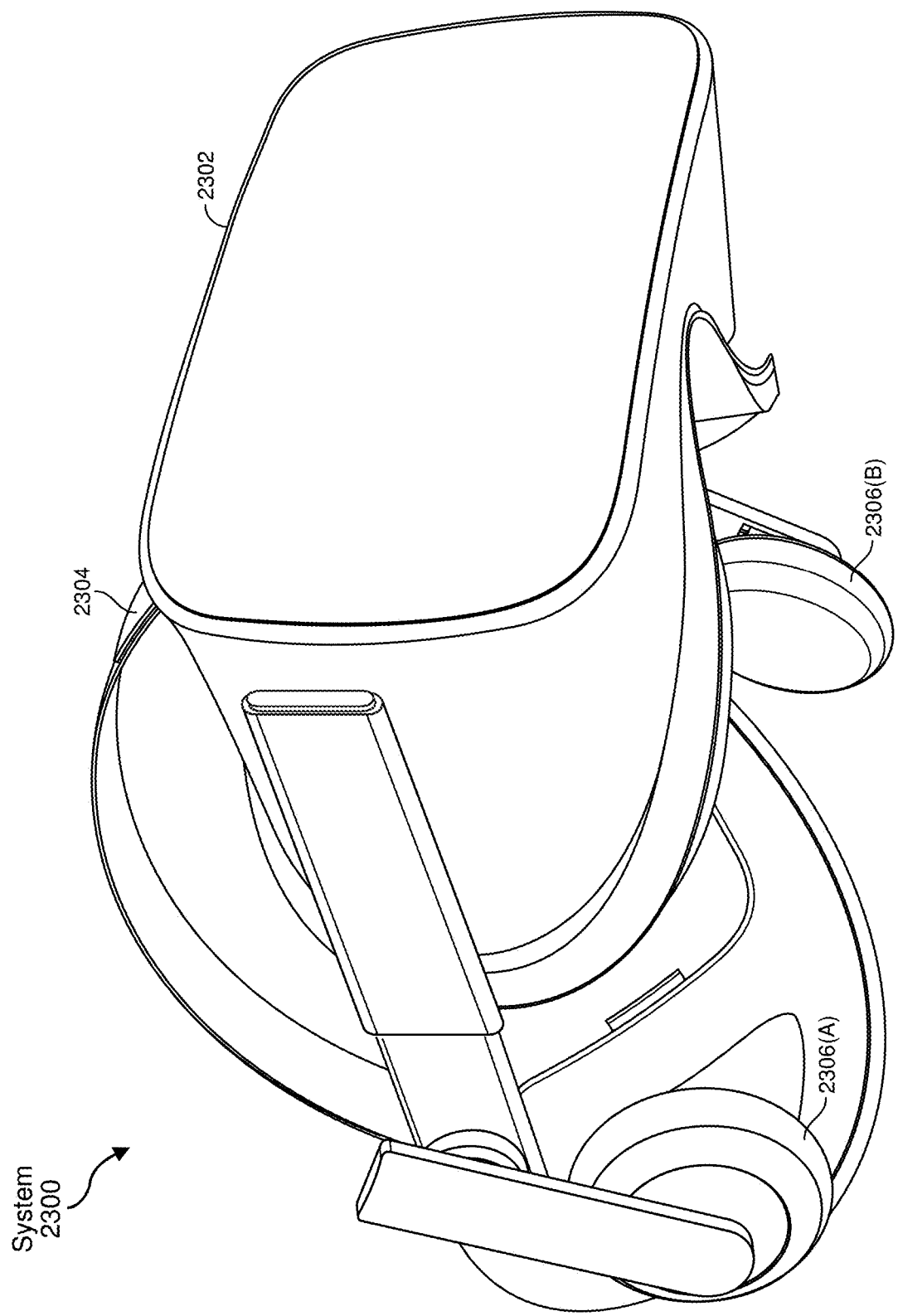
FIG. 23 is an illustration of an exemplary virtual-reality headset that may be used in connection with embodiments of this disclosure.

Turning to FIG. 22, augmented-reality system 2200 may include an eyewear device 2202 with a frame 2210 configured to hold a left display device 2215(A) and a right display device 2215(B) in front of a user's eyes. Display devices 2215(A) and 2215(B) may act together or independently to present an image or series of images to a user. While augmented-reality system 2200 includes two displays, embodiments of this disclosure may be implemented in augmented-reality systems with a single NED or more than two NEDs.

In some embodiments, augmented-reality system 2200 may include one or more sensors, such as sensor 2240. Sensor 2240 may generate measurement signals in response to motion of augmented-reality system 2200 and may be located on substantially any portion of frame 2210. Sensor 2240 may represent a position sensor, an inertial measurement unit (IMU), a depth camera assembly, a structured light emitter and/or detector, or any combination thereof. In some embodiments, augmented-reality system 2200 may or may not include sensor 2240 or may include more than one sensor. In embodiments in which sensor 2240 includes an IMU, the IMU may generate calibration data based on measurement signals from sensor 2240. Examples of sensor 2240 may include, without limitation, accelerometers, gyroscopes, magnetometers, other suitable types of sensors that detect motion, sensors used for error correction of the IMU, or some combination thereof.

Augmented-reality system 2200 may also include a microphone array with a plurality of acoustic transducers 2220(A)-2220(J), referred to collectively as acoustic transducers 2220. Acoustic transducers 2220 may be transducers that detect air pressure variations induced by sound waves. Each acoustic transducer 2220 may be configured to detect sound and convert the detected sound into an electronic format (e.g., an analog or digital format). The microphone array in FIG. 22 may include, for example, ten acoustic transducers: 2220(A) and 2220(B), which may be designed to be placed inside a corresponding ear of the user, acoustic transducers 2220(C), 2220(D), 2220(E), 2220(F), 2220(G), and 2220(H), which may be positioned at various locations on frame 2210, and/or acoustic transducers 2220(1) and 2220(J), which may be positioned on a corresponding neckband 2205.

In some embodiments, one or more of acoustic transducers 2220(A)-(F) may be used as output transducers (e.g., speakers). For example, acoustic transducers 2220(A) and/or 2220(B) may be earbuds or any other suitable type of headphone or speaker.

The configuration of acoustic transducers 2220 of the microphone array may vary. While augmented-reality system 2200 is shown in FIG. 22 as having ten acoustic transducers 2220, the number of acoustic transducers 2220 may be greater or less than ten. In some embodiments, using higher numbers of acoustic transducers 2220 may increase the amount of audio information collected and/or the sensitivity and accuracy of the audio information. In contrast, using a lower number of acoustic transducers 2220 may decrease the computing power required by an associated controller 2250 to process the collected audio information. In addition, the position of each acoustic transducer 2220 of the microphone array may vary. For example, the position of an acoustic transducer 2220 may include a defined position on the user, a defined coordinate on frame 2210, an orientation associated with each acoustic transducer 2220, or some combination thereof.

Acoustic transducers 2220(A) and 2220(B) may be positioned on different parts of the user's ear, such as behind the pinna, behind the tragus, and/or within the auricle or fossa. Or, there may be additional acoustic transducers 2220 on or surrounding the ear in addition to acoustic transducers 2220 inside the ear canal. Having an acoustic transducer 2220 positioned next to an ear canal of a user may enable the microphone array to collect information on how sounds arrive at the ear canal. By positioning at least two of acoustic transducers 2220 on either side of a user's head (e.g., as binaural microphones), augmented-reality device 2200 may simulate binaural hearing and capture a 3D stereo sound field around about a user's head. In some embodiments, acoustic transducers 2220(A) and 2220(B) may be connected to augmented-reality system 2200 via a wired connection 2230, and in other embodiments acoustic transducers 2220(A) and 2220(B) may be connected to augmented-reality system 2200 via a wireless connection (e.g., a Bluetooth connection). In still other embodiments, acoustic transducers 2220(A) and 2220(B) may not be used at all in conjunction with augmented-reality system 2200.

Acoustic transducers 2220 on frame 2210 may be positioned along the length of the temples, across the bridge, above or below display devices 2215(A) and 2215(B), or some combination thereof. Acoustic transducers 2220 may be oriented such that the microphone array is able to detect sounds in a wide range of directions surrounding the user wearing the augmented-reality system 2200. In some embodiments, an optimization process may be performed during manufacturing of augmented-reality system 2200 to determine relative positioning of each acoustic transducer 2220 in the microphone array.

In some examples, augmented-reality system 2200 may include or be connected to an external device (e.g., a paired device), such as neckband 2205. Neckband 2205 generally represents any type or form of paired device. Thus, the following discussion of neckband 2205 may also apply to various other paired devices, such as charging cases, smart watches, smart phones, wrist bands, other wearable devices, hand-held controllers, tablet computers, laptop computers, other external compute devices, etc.

As shown, neckband 2205 may be coupled to eyewear device 2202 via one or more connectors. The connectors may be wired or wireless and may include electrical and/or non-electrical (e.g., structural) components. In some cases, eyewear device 2202 and neckband 2205 may operate independently without any wired or wireless connection between them. While FIG. 22 illustrates the components of eyewear device 2202 and neckband 2205 in example locations on eyewear device 2202 and neckband 2205, the components may be located elsewhere and/or distributed differently on eyewear device 2202 and/or neckband 2205. In some embodiments, the components of eyewear device 2202 and neckband 2205 may be located on one or more additional peripheral devices paired with eyewear device 2202, neckband 2205, or some combination thereof.

Pairing external devices, such as neckband 2205, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 2200 may be provided by a paired device or shared between a paired device and an eyewear device, thus reducing the weight, heat profile, and form factor of the eyewear device overall while still retaining desired functionality. For example, neckband 2205 may allow components that would otherwise be included on an eyewear device to be included in neckband 2205 since users may tolerate a heavier weight load on their shoulders than they would tolerate on their heads. Neckband 2205 may also have a larger surface area over which to diffuse and disperse heat to the ambient environment. Thus, neckband 2205 may allow for greater battery and computation capacity than might otherwise have been possible on a stand-alone eyewear device. Since weight carried in neckband 2205 may be less invasive to a user than weight carried in eyewear device 2202, a user may tolerate wearing a lighter eyewear device and carrying or wearing the paired device for greater lengths of time than a user would tolerate wearing a heavy stand-alone eyewear device, thereby enabling users to more fully incorporate artificial-reality environments into their day-to-day activities.

Neckband 2205 may be communicatively coupled with eyewear device 2202 and/or to other devices. These other devices may provide certain functions (e.g., tracking, localizing, depth mapping, processing, storage, etc.) to augmented-reality system 2200. In the embodiment of FIG. 22, neckband 2205 may include two acoustic transducers (e.g., 2220(1) and 2220(J)) that are part of the microphone array (or potentially form their own microphone subarray). Neckband 2205 may also include a controller 2225 and a power source 2235.

Acoustic transducers 2220(1) and 2220(J) of neckband 2205 may be configured to detect sound and convert the detected sound into an electronic format (analog or digital). In the embodiment of FIG. 22, acoustic transducers 2220(1) and 2220(J) may be positioned on neckband 2205, thereby increasing the distance between the neckband acoustic transducers 2220(1) and 2220(J) and other acoustic transducers 2220 positioned on eyewear device 2202. In some cases, increasing the distance between acoustic transducers 2220 of the microphone array may improve the accuracy of beamforming performed via the microphone array. For example, if a sound is detected by acoustic transducers 2220(C) and 2220(D) and the distance between acoustic transducers 2220(C) and 2220(D) is greater than, e.g., the distance between acoustic transducers 2220(D) and 2220(E), the determined source location of the detected sound may be more accurate than if the sound had been detected by acoustic transducers 2220(D) and 2220(E).

Controller 2225 of neckband 2205 may process information generated by the sensors on neckband 2205 and/or augmented-reality system 2200. For example, controller 2225 may process information from the microphone array that describes sounds detected by the microphone array. For each detected sound, controller 2225 may perform a direction-of-arrival (DOA) estimation to estimate a direction from which the detected sound arrived at the microphone array. As the microphone array detects sounds, controller 2225 may populate an audio data set with the information. In embodiments in which augmented-reality system 2200 includes an inertial measurement unit, controller 2225 may compute all inertial and spatial calculations from the IMU located on eyewear device 2202. A connector may convey information between augmented-reality system 2200 and neckband 2205 and between augmented-reality system 2200 and controller 2225. The information may be in the form of optical data, electrical data, wireless data, or any other transmittable data form. Moving the processing of information generated by augmented-reality system 2200 to neckband 2205 may reduce weight and heat in eyewear device 2202, making it more comfortable to the user.

Power source 2235 in neckband 2205 may provide power to eyewear device 2202 and/or to neckband 2205. Power source 2235 may include, without limitation, lithium ion batteries, lithium-polymer batteries, primary lithium batteries, alkaline batteries, or any other form of power storage. In some cases, power source 2235 may be a wired power source. Including power source 2235 on neckband 2205 instead of on eyewear device 2202 may help better distribute the weight and heat generated by power source 2235.

As noted, some artificial-reality systems may, instead of blending an artificial reality with actual reality, substantially replace one or more of a user's sensory perceptions of the real world with a virtual experience. One example of this type of system is a head-worn display system, such as virtual-reality system 2300 in FIG. 23, that mostly or completely covers a user's field of view. Virtual-reality system 2300 may include a front rigid body 2302 and a band 2304 shaped to fit around a user's head. Virtual-reality system 2300 may also include output audio transducers 2306(A) and 2306(B). Furthermore, while not shown in FIG. 23, front rigid body 2302 may include one or more electronic elements, including one or more electronic displays, one or more inertial measurement units (IMUS), one or more tracking emitters or detectors, and/or any other suitable device or system for creating an artificial reality experience.

Artificial-reality systems may include a variety of types of visual feedback mechanisms. For example, display devices in augmented-reality system 2200 and/or virtual-reality system 2300 may include one or more liquid crystal displays (LCDs), light emitting diode (LED) displays, organic LED (OLED) displays, digital light project (DLP) micro-displays, liquid crystal on silicon (LCoS) micro-displays, and/or any other suitable type of display screen. Artificial-reality systems may include a single display screen for both eyes or may provide a display screen for each eye, which may allow for additional flexibility for varifocal adjustments or for correcting a user's refractive error. Some artificial-reality systems may also include optical subsystems having one or more lenses (e.g., conventional concave or convex lenses, Fresnel lenses, adjustable liquid lenses, etc.) through which a user may view a display screen. These optical subsystems may serve a variety of purposes, including to collimate (e.g., make an object appear at a greater distance than its physical distance), to magnify (e.g., make an object appear larger than its actual size), and/or to relay (to, e.g., the viewer's eyes) light. These optical subsystems may be used in a non-pupil-forming architecture (such as a single lens configuration that directly collimates light but results in so-called pincushion distortion) and/or a pupil-forming architecture (such as a multi-lens configuration that produces so-called barrel distortion to nullify pincushion distortion).

In addition to or instead of using display screens, some artificial-reality systems may include one or more projection systems. For example, display devices in augmented-reality system 2200 and/or virtual-reality system 2300 may include micro-LED projectors that project light (using, e.g., a waveguide) into display devices, such as clear combiner lenses that allow ambient light to pass through. The display devices may refract the projected light toward a user's pupil and may enable a user to simultaneously view both artificial-reality content and the real world. The display devices may accomplish this using any of a variety of different optical components, including waveguide components (e.g., holographic, planar, diffractive, polarized, and/or reflective waveguide elements), light-manipulation surfaces and elements (such as diffractive, reflective, and refractive elements and gratings), coupling elements, etc. Artificial-reality systems may also be configured with any other suitable type or form of image projection system, such as retinal projectors used in virtual retina displays.

Artificial-reality systems may also include various types of computer vision components and subsystems. For example, augmented-reality system 2200 and/or virtual-reality system 2300 may include one or more optical sensors, such as two-dimensional (2D) or 3D cameras, structured light transmitters and detectors, time-of-flight depth sensors, single-beam or sweeping laser rangefinders, 3D LiDAR sensors, and/or any other suitable type or form of optical sensor. An artificial-reality system may process data from one or more of these sensors to identify a location of a user, to map the real world, to provide a user with context about real-world surroundings, and/or to perform a variety of other functions.

Artificial-reality systems may also include one or more input and/or output audio transducers. In the examples shown in FIG. 23, output audio transducers 2306(A) and 2306(B) may include voice coil speakers, ribbon speakers, electrostatic speakers, piezoelectric speakers, bone conduction transducers, cartilage conduction transducers, tragus-vibration transducers, and/or any other suitable type or form of audio transducer. Similarly, input audio transducers may include condenser microphones, dynamic microphones, ribbon microphones, and/or any other type or form of input transducer. In some embodiments, a single transducer may be used for both audio input and audio output.

While not shown in FIG. 22, artificial-reality systems may include tactile (i.e., haptic) feedback systems, which may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial-reality devices, within other artificial-reality devices, and/or in conjunction with other artificial-reality devices.

By providing haptic sensations, audible content, and/or visual content, artificial-reality systems may create an entire virtual experience or enhance a user's real-world experience in a variety of contexts and environments. For instance, artificial-reality systems may assist or extend a user's perception, memory, or cognition within a particular environment. Some systems may enhance a user's interactions with other people in the real world or may enable more immersive interactions with other people in a virtual world. Artificial-reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visual aids, etc.). The embodiments disclosed herein may enable or enhance a user's artificial-reality experience in one or more of these contexts and environments and/or in other contexts and environments.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

It will be understood that when an element such as a layer or a region is referred to as being formed on, deposited on, or disposed "on" or "over" another element, it may be located directly on at least a portion of the other element, or one or more intervening elements may also be present. In contrast, when an element is referred to as being "directly on" or "directly over" another element, it may be located on at least a portion of the other element, with no intervening elements present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a non-volatile medium material that comprises or includes paraffin oil include embodiments where a non-volatile medium material consists essentially of paraffin oil and embodiments where a non-volatile medium material consists of paraffin oil.

What is claimed is:

1. A method comprising:
    forming a layer of a non-volatile medium material over a surface of a mold;
    forming a layer of a molecular feedstock over a surface of the non-volatile medium material, the molecular feedstock comprising an organic solid crystal precursor;
    forming crystal nuclei from the organic solid crystal precursor; and
    growing the crystal nuclei to form a biaxially-oriented organic solid crystal thin film having mutually orthogonal refractive indices, $n_1 \neq n_2 \neq n_3$, wherein in-plane refractive indices ($n_2$, $n_3$) of the biaxially-oriented organic solid crystal thin film are related according to $|n_2-n_3|>0.05$.

2. The method of claim 1, wherein the non-volatile medium material comprises a liquid selected from the group consisting of silicone oil, paraffin oil, a fluorinated polymer, a polyolefin and polyethylene glycol.

3. The method of claim 1, wherein the molecular feedstock comprises a process enhancer selected from the group consisting of polymers, oligomers, and small molecules, the process enhancer having a melting onset temperature of at least approximately 20° C. less than a melting onset temperature of the organic solid crystal precursor.

4. The method of claim 1, wherein the organic solid crystal precursor comprises a crystallizable organic molecule.

5. The method of claim 1, wherein forming the layer of molecular feedstock comprises injecting the molecular feedstock into the mold.

6. The method of claim 1, wherein the crystal nuclei are formed within a nucleation region of the layer of the molecular feedstock.

7. The method of claim 6, wherein forming the crystal nuclei comprises heating the layer of the molecular feedstock to a temperature less than a melting onset temperature of the organic solid crystal precursor within the nucleation region.

8. The method of claim 6, wherein forming the crystal nuclei comprises melting selected crystal nuclei outside of the nucleation region.

9. The method of claim 1, further comprising separating the organic solid crystal thin film from the surface of the non-volatile medium material.

10. A thin film comprising a biaxially-oriented organic solid crystal layer having mutually orthogonal refractive indices, $n_1 \neq n_2 \neq n_3$, wherein in-plane refractive indices ($n_2$, $n_3$) of the biaxially-oriented organic solid crystal layer are related according to $|n_2-n_3|>0.05$.

11. The thin film of claim 10, wherein the biaxially-oriented organic solid crystal layer comprises a single crystal.

12. The thin film of claim 10, wherein in-plane refractive indices ($n_2$, $n_3$) of the biaxially-oriented organic solid crystal layer are related according to $(n_2+n_3)/2>1.5$.

13. The thin film of claim 10, wherein an out-of-plane refractive index ($n_1$) of the biaxially-oriented organic solid crystal layer is related to in-plane refractive indices ($n_2$, $n_3$) of the biaxially-oriented organic solid crystal layer according to $$n_1 = \frac{1}{2\pi} \int_0^{2\pi} \sqrt{(n_2 \sin\varphi)^2 + (n_3 \cos\varphi)^2}\, d\varphi.$$

14. The thin film of claim 10, wherein a major surface of the thin film comprises a periodic array of structures.

15. An optical element comprising the thin film of claim 10, wherein the optical element comprises a passive component selected from the group consisting of a waveguide substrate, a grating, a microlens, a prismatic lens, a Fresnel lens, a reflective polarizer, a Pancharatnam-Berry phase (PBP) lens, an ophthalmic lens, and a photonic integrated circuit.

16. An optical element comprising the thin film of claim 10, wherein the optical element comprises an active component selected from the group consisting of a phase modulator, a photonic integrated circuit, a polarization modulator, and an amplitude modulator.

17. A method comprising:
providing a layer of a non-volatile medium material;
forming a layer of a molecular feedstock over a surface of the non-volatile medium material, the molecular feedstock comprising an organic solid crystal precursor;
forming crystal nuclei from the organic solid crystal precursor within a nucleation region of the layer of the molecular feedstock; and
growing the crystal nuclei to form a biaxially-oriented organic solid crystal thin film having mutually orthogonal refractive indices, $n_1 \neq n_2 \neq n_3$, wherein in-plane refractive indices ($n_2$, $n_3$) of the biaxially-oriented organic solid crystal thin film are related according to $|n_2-n_3|>0.05$.

18. The method of claim 17, wherein the organic solid crystal precursor comprises a crystallizable organic molecule.

19. The method of claim 17, wherein forming the crystal nuclei comprises heating the layer of the molecular feedstock to a temperature less than a melting onset temperature of the organic solid crystal precursor within the nucleation region.

* * * * *